(12) United States Patent
Lin et al.

(10) Patent No.: US 11,079,671 B2
(45) Date of Patent: Aug. 3, 2021

(54) FABRICATING METHOD OF PHOTOMASK, PHOTOMASK STRUCTURE THEREOF, AND SEMICONDUCTOR MANUFACTURING METHOD USING THE SAME

(71) Applicant: TAIWAN SEMICONDUCTOR MANUFACTURING COMPANY LTD., Hsinchu (TW)

(72) Inventors: Cheng-Ming Lin, Yunlin County (TW); Hao-Ming Chang, Pingtung (TW); Chih-Ming Chen, Taoyuan County (TW); Chung-Yang Huang, Chiayi County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 81 days.

(21) Appl. No.: 16/548,876

(22) Filed: Aug. 23, 2019

(65) Prior Publication Data

US 2021/0055647 A1 Feb. 25, 2021

(51) Int. Cl.
*G03F 1/44* (2012.01)
*G03F 1/42* (2012.01)
*G03F 1/48* (2012.01)

(52) U.S. Cl.
CPC ............. *G03F 1/44* (2013.01); *G03F 1/42* (2013.01); *G03F 1/48* (2013.01)

(58) Field of Classification Search
CPC ................. G03F 1/42; G03F 1/44; G03F 1/48
USPC ................................................................ 430/5
See application file for complete search history.

(56) References Cited

U.S. PATENT DOCUMENTS

| | | |
|---|---|---|
| 8,796,666 B1 | 8/2014 | Huang et al. |
| 8,945,803 B2 | 2/2015 | Chen et al. |
| 8,987,689 B2 | 3/2015 | Chen et al. |
| 9,093,530 B2 | 4/2015 | Huang et al. |
| 9,269,537 B2 | 2/2016 | Tseng et al. |
| 9,305,799 B2 | 4/2016 | Chen et al. |
| 9,336,993 B2 | 5/2016 | Yu |
| 9,367,661 B2 | 6/2016 | Jou et al. |
| 9,529,959 B2 | 12/2016 | Wang et al. |
| 9,548,303 B2 | 1/2017 | Lee et al. |

*Primary Examiner* — Christopher G Young
(74) *Attorney, Agent, or Firm* — WPAT, P.C., Intellectual Property Attorneys; Anthony King

(57) ABSTRACT

A method for fabricating a photomask is provided. The method includes several operations. A photomask substrate, having a chip region and a peripheral region adjacent to the chip region, is received. A reference pattern is formed by emitting one first radiation shot and a first beta pattern is formed by emitting a plurality of second radiation shots in the peripheral region. The plurality of second radiation shots are emitted along a first direction. A roughness of a boundary of the first beta pattern along the first direction is compared to a roughness of a boundary of the reference pattern along the first direction from a top view perspective. An alignment of the plurality of second radiation shots is adjusted if a result of the comparison exceeds a tolerance, or the photomask is formed. A photomask structure thereof and a method for manufacturing a semiconductor are also provided.

20 Claims, 28 Drawing Sheets

FABRICATING METHOD OF PHOTOMASK, PHOTOMASK STRUCTURE THEREOF, AND SEMICONDUCTOR MANUFACTURING METHOD USING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down results in increased complexities of processing and manufacturing ICs, and the processes required for effective quality control of the products have become increasingly stringent.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
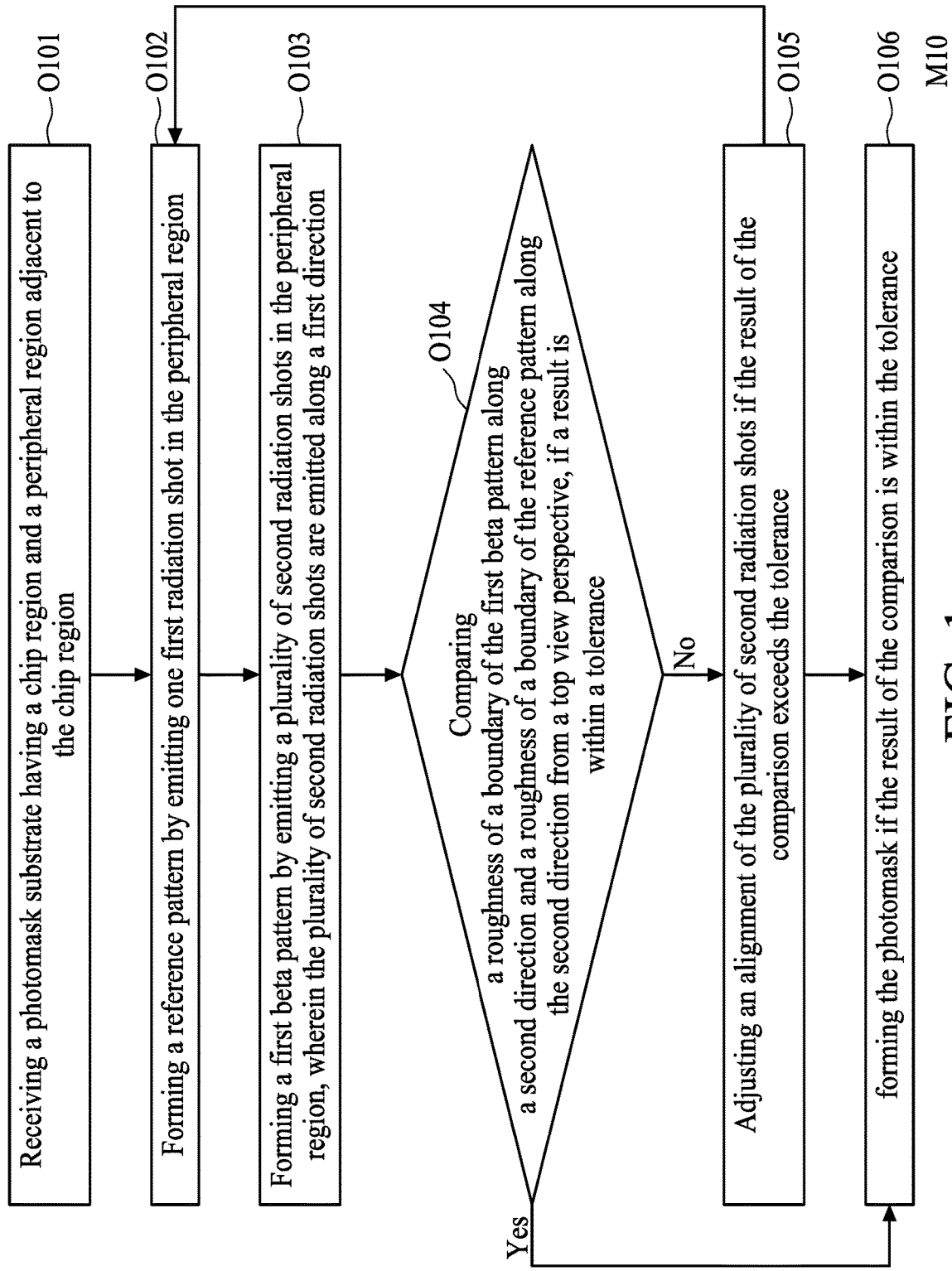
FIG. 1 is a flowchart showing various stages of a method for fabricating a photomask in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A lithography process is commonly used in a semiconductor device fabrication process whereby the lithographic process transfers patterns of photomasks to a target substrate, typically a semiconductor substrate having a photosensitive layer disposed thereon. If the photomask has a defect, the defect or the change in a pattern of a photomask is likewise transferred to the target substrate as a defect in the pattern developed onto the semiconductor substrate. There are many causes of the defects. For example, the defects can result from deterioration of parts of a mask writer during fabrication of the photomask. If the defects are caused by the mask writer, a pattern of a photosensitive layer used in an exposure (or writing) operation of the photomask is distorted. However, tiny changes in the pattern of the photosensitive layer are difficult to detect, and the changes in the pattern eventually become the defects after multiple pattern-transferring operations are performed on multiple layers through the photosensitive layer.

The defects (can be resulted from tiny changes or roughness of boundaries of the pattern of the photosensitive layer) can be detected on a finished photomask. An after strip inspection (ASI) of the finished photomask is provided to ensure the quality of the photomask before the photomask is utilized in a patterning process of a semiconductor substrate, thereby improving product yield of the semiconductor substrate. The ASI can be performed to compare general shapes of the pattern of the photomask from a top view perspective without conducting detailed examinations that specific issues resulting the defect cannot be identified. In addition, at the time of the finding of the defects in the ASI, a next lot or even the next two lots of photomask substrates is already entered the mask writer, and similar defects in the next one or two lots of the photomasks is detected. A product yield of the photomasks is reduced.

The present disclosure provides a method for fabricating a photomask, including an after etching inspection (AEI) or an after developing inspection (ADI), is provided. The method of the present disclosure includes performing examinations of a pattern of a photomask with detailed variations in order to provide an accurate and on-line or instant inspection during the fabrication of the photomask. The inspection of the present disclosure can provide analysis of the defects of the photomask and a solution can be prepared based on the inspection result. If the photomask fails the inspection, the process can be halted and the issues can be instantly corrected. Similar defects and the scrapping of the next one or two lots of photomasks can be prevented, and thus product yield of the photomask can be enhanced.

FIG. 1 is a flowchart showing a method M10 for fabricating a photomask in accordance with some embodiments of the present disclosure. The method M10 includes several operations: (O101) receiving a photomask substrate having a chip region and a peripheral region adjacent to the chip region; (O102) forming a reference pattern by emitting one first radiation shot in the peripheral region; (O103) forming a first beta pattern by emitting a plurality of second radiation shots in the peripheral region, wherein the plurality of second radiation shots are emitted along a first direction; (O104) comparing a roughness of a boundary of the first beta pattern along the first direction and a roughness of a boundary of the reference pattern along the first direction from a top view perspective; (O105) adjusting an alignment of the plurality of second radiation shots if a result of the comparison exceeds a tolerance; and (O106) forming the photomask if the result of the comparison is within the tolerance. In some embodiments, after the adjusting of the alignment of the plurality of second radiation shots (O105), the method M10 can return to the operations O102 and O103. In some embodiments, the operations O105, O102, O103 and O104 can be repeatedly performed until the result of the comparison is within the tolerance and the method M10 proceeds to the operation O106.

Figure 2:
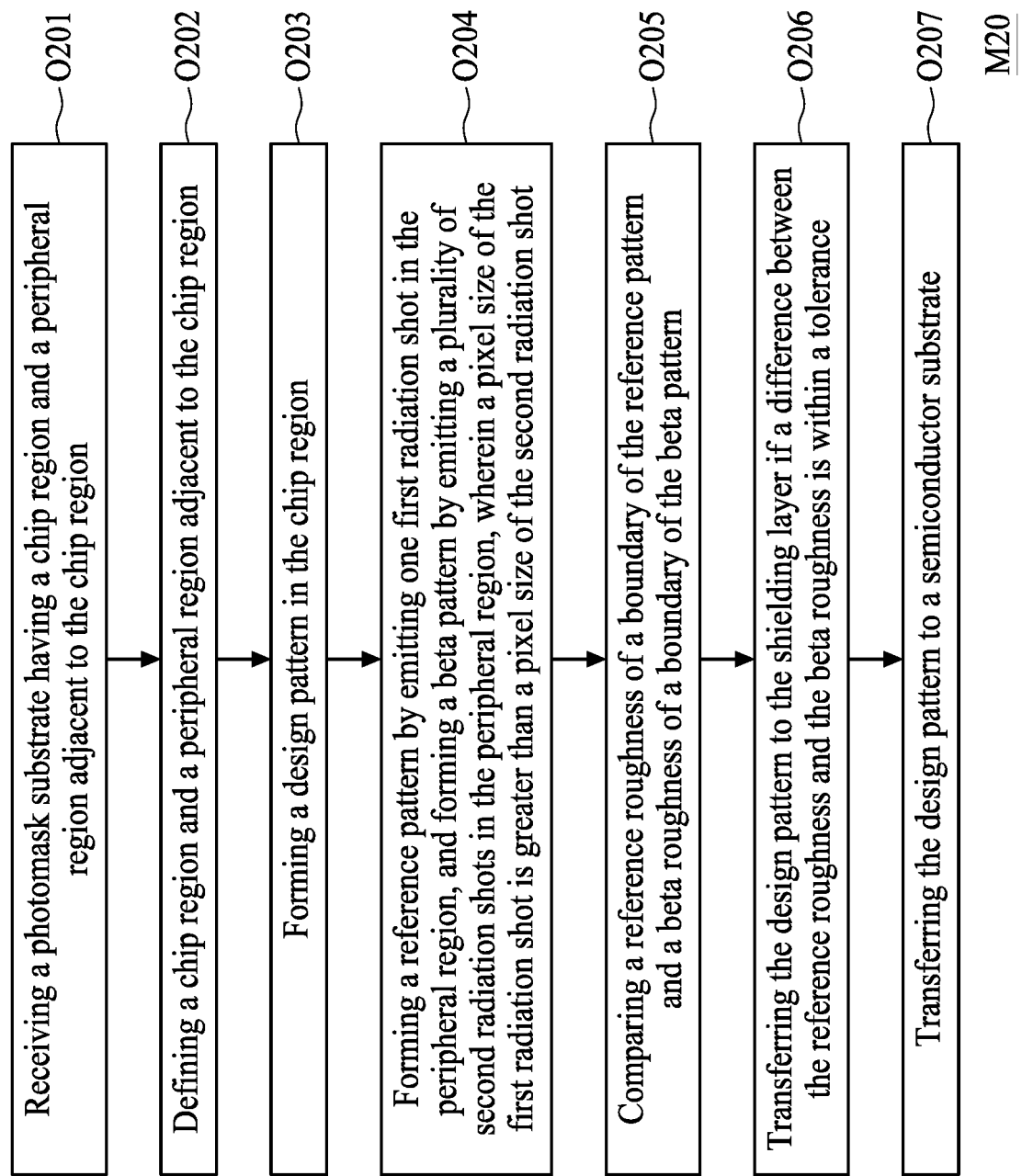
FIG. 2 is a flowchart showing various stages of a method for manufacturing a semiconductor in accordance with some embodiments of the present disclosure.

If a photomask passes one or more inspections of the present disclosure, the photomask is utilized in a patterning operation of a semiconductor substrate. Thus, applying concepts similar to those applied in the method M10, a method M20 for manufacturing a semiconductor is provided. FIG. 2 is a flowchart showing the method M20 for fabricating a photomask in accordance with some embodiments of the present disclosure. The method M20 includes several operations: (O201) receiving a photomask substrate including a shielding layer; (O202) defining a chip region and a peripheral region adjacent to the chip region; (O203) forming a design pattern in the chip region; (O204) forming a reference pattern by emitting one first radiation shot in the peripheral region, and forming a beta pattern by emitting a plurality of second radiation shots in the peripheral region, wherein a pixel size of the first radiation shot is greater than a pixel size of the second radiation shot; (O205) comparing a reference roughness of a boundary of the reference pattern and a beta roughness of a boundary of the beta pattern; (O206) transferring the design pattern to the shielding layer if a difference between the reference roughness and the beta roughness is within a tolerance; and (O207) transferring the design pattern to a semiconductor substrate.

In order to illustrate concepts and the methods M10 and M20 of the present disclosure, various embodiments are provided below. However, it is not intended to limit the present disclosure to specific embodiments. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures.

Figure 3:
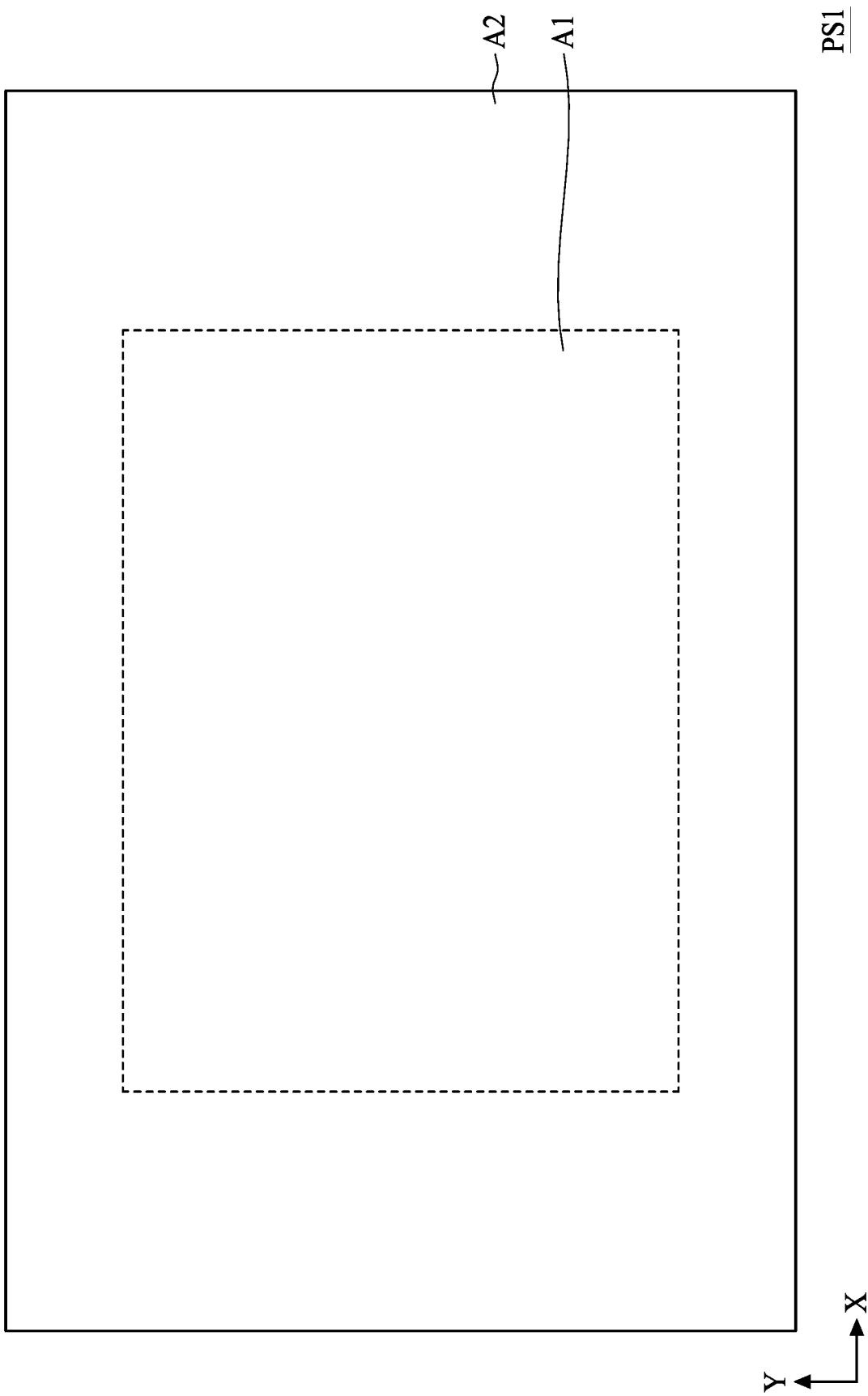
FIGS. 3 to 7 are schematic diagrams of various stages of a method in accordance with one or more embodiments of the present disclosure.
Figure 4:
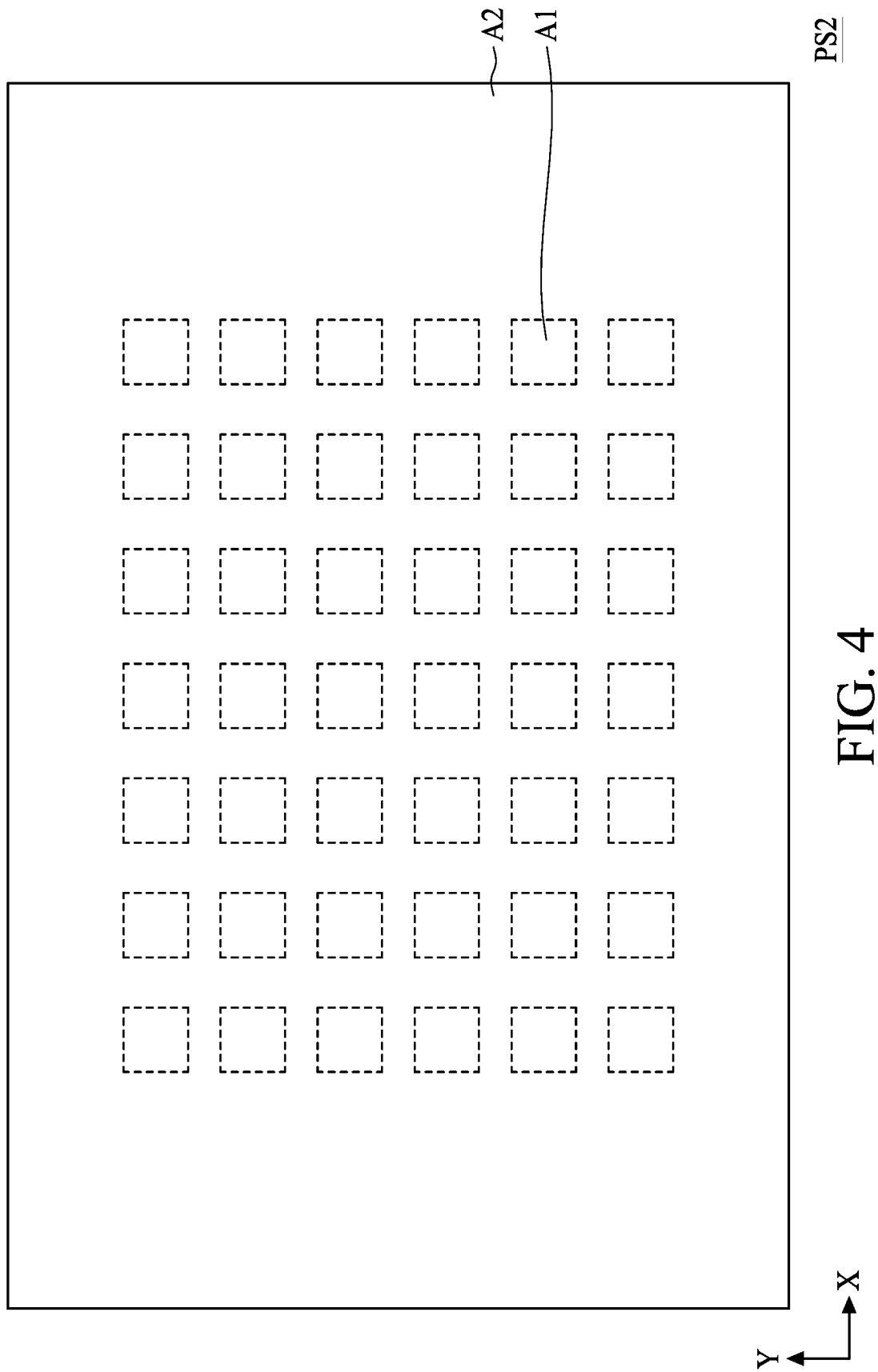

FIGS. 3 to 4 are schematic diagrams illustrating the operation O101 of the method M10 and/or the operations O201 to O202 of the method M20 in accordance with some embodiments of the present disclosure. A photomask substrate PS1 or PS2 is received, and includes a chip region A1 and a peripheral region A2. In some embodiments, the photomask substrate PS1 or PS2 includes a carrier layer, a shielding layer over the carrier layer, a hard layer over the shielding layer, and optionally a mask layer over the hard layer. A detailed illustration of the structure of the photomask substrate PS1 or PS2 is provided later in the specification.

In some embodiments, the peripheral region A2 surrounds the chip region A1. In some embodiments, the chip region A1 is at a center of the photomask substrate PS1, and the peripheral region A2 is along the boundaries of the photomask substrate PS1 as shown in FIG. 3. In some embodiments, the patterns formed in the chip region A1 are to be transferred to a semiconductor substrate, and patterns formed in the peripheral region A2 are not to be transferred to the semiconductor substrate. In some embodiments, the chip region A1 is an irradiated area during an exposure process. In some embodiments, the photomask substrate PS2 includes several chip regions A1 as shown in FIG. 4, and the peripheral region A2 surrounds and separates each of the chip regions A1. In some embodiments, portions of the peripheral region A2 between adjacent chip regions A1 are spaces serving as scribe lines. In some embodiments, patterns formed in the peripheral region A2 are for a comparison operation of the present disclosure. In some embodiments, the patterns formed in the peripheral region A2 between the chip regions A1 are transferred to a scribe line between chips of a semiconductor substrate.

Figure 5:
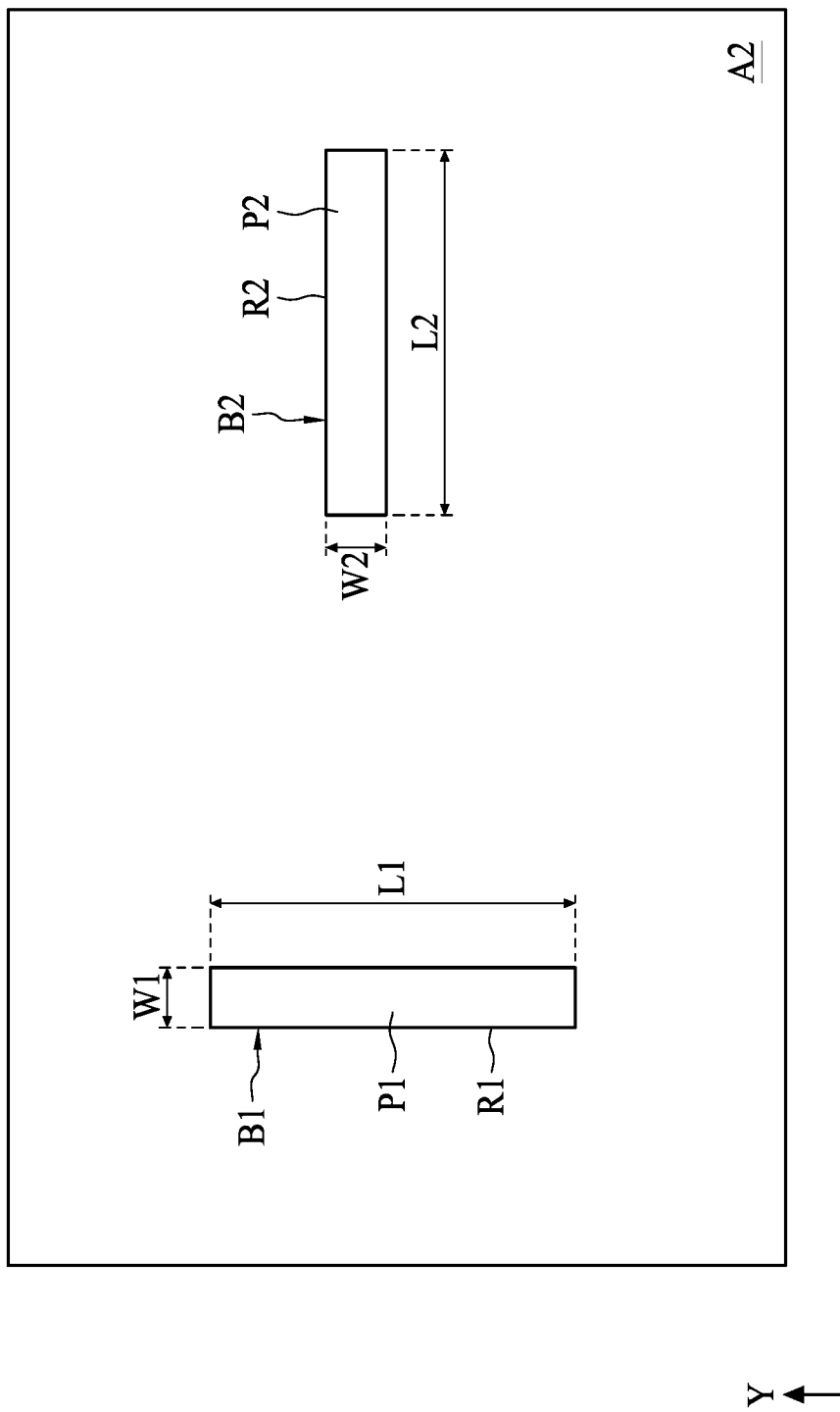
Figure 6:
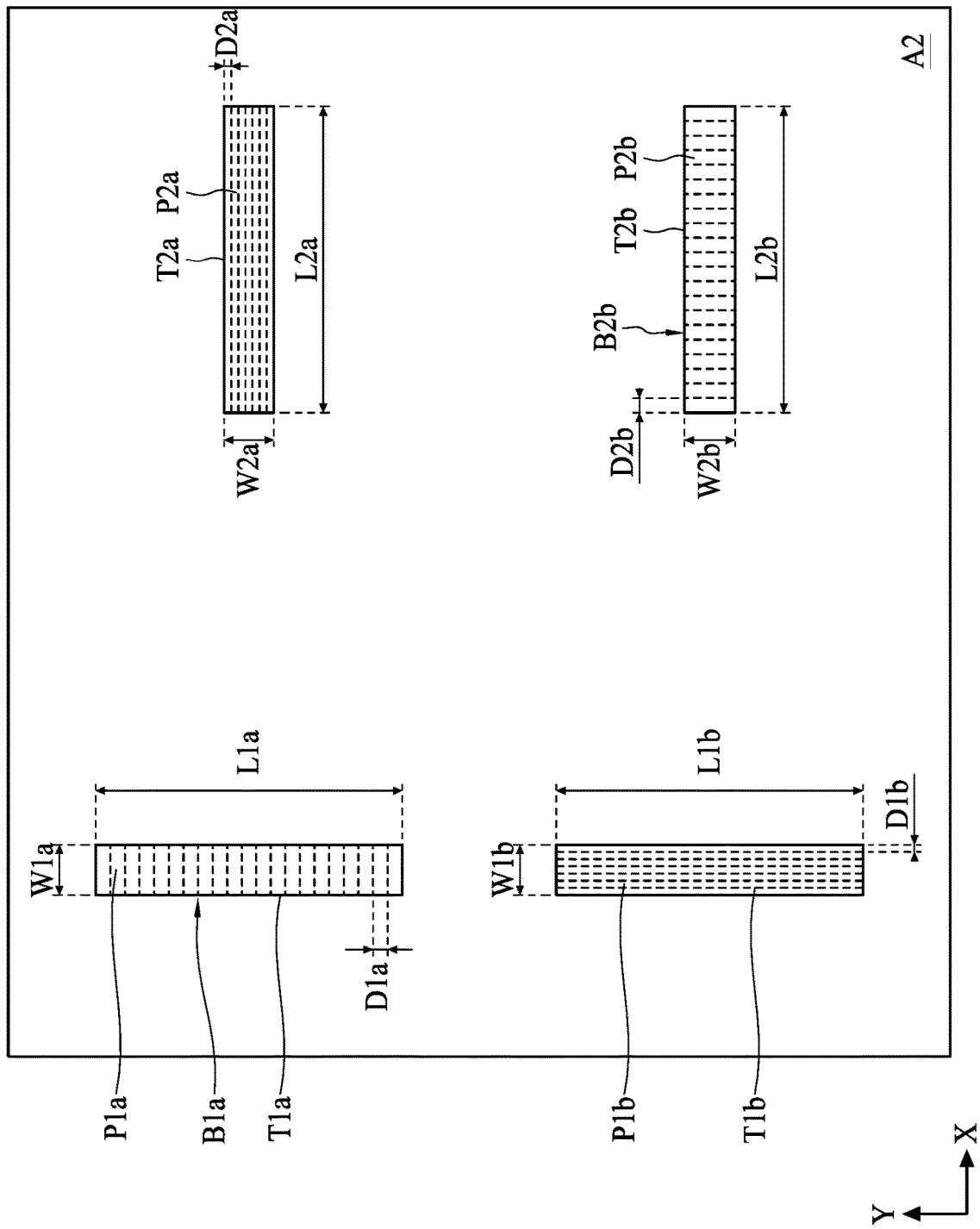
Figure 7:
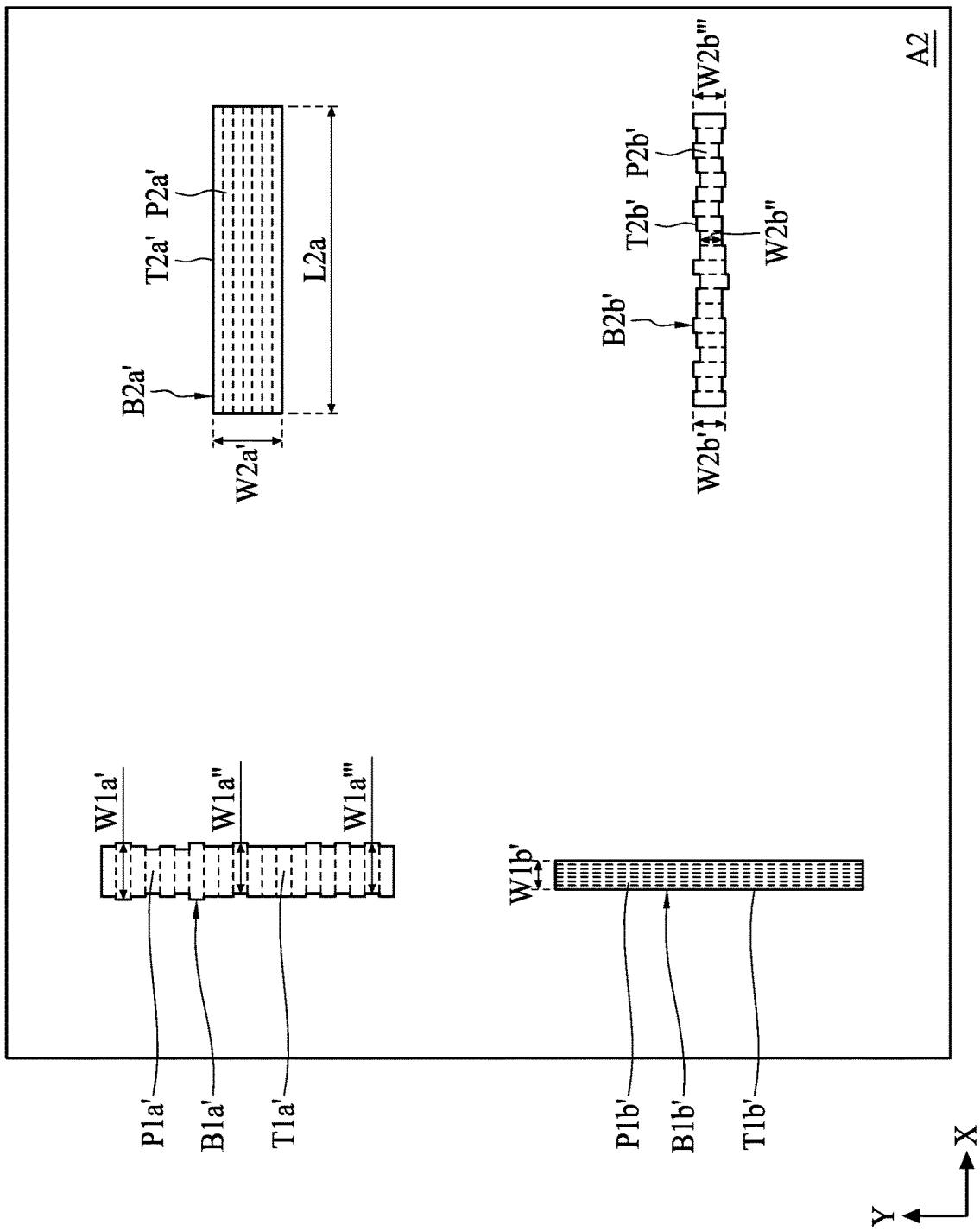

FIGS. 5 to 7 are schematic diagrams illustrating the operations O102 to O103 of the method M10 and/or the operations O204 to O205 of the method M20 in accordance with some embodiments of the present disclosure. For ease of illustration, only a portion of the peripheral region A2 is shown in FIGS. 5 to 7.

FIG. 5 illustrates the operation O102 of the method M10 and/or the operation O204 of the method M20 in accordance with some embodiments. A reference pattern R1 is formed by emitting one radiation shot P1 in the peripheral region A2. A size of the reference pattern R1 is the same as a pixel size of the radiation shot P1, and a pixel shape of the reference pattern R1 is the same as a pixel shape of the radiation shot P1. In some embodiments, the method M10 and/or the method M20 further includes forming a reference pattern R2 by emitting one radiation shot P2, wherein an orientation of the reference pattern R2 is different from an orientation of the reference pattern R1 so critical dimensions along different directions can be measured. A size of the reference pattern R2 is the same as a pixel size of the radiation shot P2, and a pixel shape of the reference pattern R2 is the same as a pixel shape of the radiation shot P2. In some embodiments, the radiation shot P1 and/or the radiation shot P2 includes electron beam or laser beam depending on the mask writers or application.

In the following description, a length of a pattern is measured along a longitudinal direction of the pattern, and a width of a pattern is measured along a lateral direction of the pattern, wherein the lateral direction is substantially perpendicular to the longitudinal direction. In addition, a roughness is focused on a boundary along the longitudinal direction of the pattern. A plurality of widths is measured at different positions of the pattern. For instance, a top width at one end of the pattern, a center width at a waist of the pattern, and a bottom width at the other end of the pattern are measured.

In additions, various reference patterns and beta patterns are provided in accordance with different embodiments. For ease of illustration and understanding, repeat description are omitted if similar parameters, conditions, characters, properties, functions, sub-operations or optional operations have already illustrated in other paragraphs or sections of the specification. However, it is not intended to limit the present disclosure.

In some embodiments, the reference pattern R1 is polygonal. In some embodiments, the reference pattern R1 is a rectangle having a longitudinal direction along a Y direction and a lateral direction along an X direction. In some embodiments, a width W1 measured along the X direction of the reference pattern R1 is in a range of 90 to 150 nm (nanometers). In some embodiments, a length L1 measured along the Y direction of the configuration R1 is in a range of 200 to 300 nm. In some embodiments, a boundary B1 of the reference pattern R1 is measured along the Y direction, and a reference roughness can be obtained by measuring or comparing the boundary B1 of the reference pattern R1. In some embodiments, the width W1 and the length L1 of the reference pattern R1 formed comply with great precision to a desired width and length of the reference pattern R1.

In some embodiments, the reference pattern R2 is polygonal. In some embodiments, the reference pattern R2 is a rectangle. In some embodiments, the reference pattern R1 and the reference pattern R2 are substantially perpendicular. In some embodiments, the reference pattern R1 has a longitudinal direction along the X direction and a lateral direction along the Y direction. In some embodiments, the reference pattern R2 is separated from the reference pattern R1 in the peripheral region A2. In some embodiments, the reference pattern R2 is in contact with the reference pattern R1 in the peripheral region A2. In some embodiments, a boundary B2 of the reference pattern R2 is measured along the X direction, and a reference roughness can be obtained by measuring or comparing the boundary B2 of the reference pattern R2. In some embodiments, a width W2 and a length L2 of the reference pattern R2 formed comply with great precision to a desired width and length of the reference pattern R2.

In some embodiments, for ease of measurement and detection, the reference patterns R1 and R2 are formed with the same configuration (including size and shape) in the peripheral region A2 with different orientations as shown in FIG. 5. However, the disclosure is not limited herein. In some embodiments, the reference patterns R1 and R2 are with different configurations and with different orientations. In some embodiments, the pixel size of the radiation shot P1 is different from the pixel size of the radiation shot P2. In some embodiments, the shape of the reference pattern R1 is different from the shape of the reference pattern R2.

FIG. 6 illustrates the operations O103 to O104 of the method M10 and/or the operations O204 to O205 of the method M20 in accordance with some embodiments. At least one beta pattern is formed by emitting a plurality of radiation shots in the peripheral region A2. A pixel size of each of the plurality of radiation shots for forming the beta patterns is smaller than a pixel size of a corresponding reference pattern (e.g., the reference pattern R1 or R2). In some embodiments, emission of the plurality of radiation shots includes repeatedly emitting the radiation shots along one direction, and thus the radiation shots are connected to each other to form the beta pattern corresponding to the reference pattern. In some embodiments, the plurality of radiation shots is emitted to form one beta pattern. In some embodiments, each of the plurality of radiation shots has a same exposure time and a same energy strength.

In some embodiments, a beta pattern T1a according to the configuration of the reference pattern R1 is formed by emitting a plurality of radiation shots P1a. In some embodiments, a dimension D1a of the radiation shot P1a along a longitudinal direction of the beta pattern T1a is in a range of 5 to 30 nm depending on the application. In some embodiments, the dimension D1a of the radiation shot P1a is the same as a minimum dimension of the radiation shot used in fabricating a design pattern in the chip region A1 of the photomask substrate PS1.

In some embodiments, the beta pattern T1a formed has a configuration and an orientation that are substantially identical to those of the reference pattern R1 from a top view perspective of the photomask substrate PS1. In some embodiments, the radiation shots P1a are emitted and connected along the longitudinal direction of the beta pattern T1a. In some embodiments, the longitudinal direction of the beta pattern T1a is the Y direction. In some embodiments, a roughness of a boundary B1a of the beta pattern T1a along the Y direction is obtained and compared to the roughness of the boundary B1 of the reference pattern R1. In some embodiments, the roughness of the boundary B1 of the reference pattern R1 is relatively low due to the single radiation shot P1 comparing with the roughness of the boundary B1a resulted from connection of the multiple radiation shots P1a. In some embodiments, the roughness of the boundary B1a is similar to or substantially same as the roughness of the boundary B1 due to precise alignment of the radiation shots P1a along the Y direction of the beta pattern T1a.

In some embodiments, the method M10 or the method M20 further includes comparing one or more widths W1a with the width W1 of the reference pattern R1. In some embodiments, the operation of comparing the widths is performed after or prior to the operation 104 or the operation 205. In some embodiments, a width W1a of the beta pattern T1a is substantially equal to the width W1 of the reference pattern R1 due to effective control of time of exposure and energy of the radiation shot. In some embodiments, a length L1a and a slope of the beta pattern T1a are also substantially the same as those of the reference pattern R1.

In some embodiments, a beta pattern T1b is further formed according to the configuration of the reference pattern R1 by emitting a plurality of radiation shots P1b. In some embodiments, the beta pattern T1b has a configuration and an orientation substantially identical to those of the reference pattern R1 from a top view perspective of the photomask substrate PS1. In some embodiments, the radiation shots P1b are emitted and connected along a lateral direction (i.e., the X direction) of the beta pattern T1b. In some embodiments, a dimension D1b of the radiation shot P1b is measured along the X direction, which is the lateral direction of the beta pattern T1b. In some embodiments, a width W1b along the X direction of the beta pattern T1b is substantially equal to the width W1 of the reference pattern R1 due to effective control of time of exposure and energy of the radiation shots P1b. In some embodiments, a length L1b and a slope of the beta pattern T1b are also substantially the same as those of the reference pattern R1.

In some embodiments, a beta pattern T2a is formed according to the configuration of the reference pattern R2 by emitting a plurality of radiation shots P2a. In some embodiments, the beta pattern T2a formed has a configuration and orientation that are substantially identical to the reference pattern R2 in the peripheral region A2 from a top view perspective of the photomask substrate PS1. In some embodiments, the radiation shots P2a are emitted and connected along a lateral direction (e.g., the Y direction) of the beta pattern T2a. In some embodiments, a dimension D2a of the radiation shot P2a is measured along the Y direction, which is the lateral direction of the beta pattern T2a. In some embodiments, a width W2a along the Y direction of the beta pattern T2a is substantially equal to the width W2 of the reference pattern R2 due to effective control of time of exposure and energy of the radiation shots P2a. In some embodiments, a length L2a and a slope of the beta pattern T2a are also substantially the same as those of the reference pattern R2.

In some embodiments, a beta pattern T2b is formed according to the configuration of the reference pattern R2 by a plurality of radiation shots P2b. In some embodiments, the beta pattern T2b formed has a configuration and an orientation that are substantially identical to the reference pattern R2 in the peripheral region A2 from a top view perspective of the photomask substrate PS1. In some embodiments, the radiation shots P2b are emitted and connected along a longitudinal direction (e.g., the X direction) of the beta pattern T2b. In some embodiments, a roughness of a boundary B2b of the beta pattern T2b along the longitudinal direction is obtained and compared to the roughness of the boundary B2. In some embodiments, the roughness of the boundary B2 of the reference pattern R2 is relatively low due to the single radiation shot P1 comparing with the roughness of the boundary B2b resulted from connection of the multiple radiation shots P2b. In some embodiments, the roughness of the boundary B2b is similar to or substantially same as the roughness of the boundary B2 due to precise alignment of the radiation shots P2b along the X direction of the beta pattern T2b. In some embodiments, a width W2b of the beta pattern T2b is substantially equal to the width W2 of the reference pattern R1 due to effective control of time of exposure and energy of the radiation shot. In some embodiments, a length L2b and a slope of the beta pattern T2b are also substantially the same as those of the reference pattern R1.

Accordingly, one or more reference patterns R1 and R2 and one or more of the beta patterns T1a, T1b, T2a and T2b are formed in the peripheral region A2 depending on the factors to be tested. In some embodiments, the reference patterns R1 and R2, and all of the beta patterns T1a, T1b, T2a and T2b, are formed to test functions of the mask writer under various conditions so that causes of different defects can be identified.

In some embodiments, too much or too little radiation energy in the exposure or writing operation of fabrication of a photomask, or deterioration of a shaping deflector of the mask writer, can lead to different types of defects on the photomask. FIG. 7 illustrates the operations O103 to O104 of the method M10 and/or the operations O204 to O205 of the method M20 in accordance with other embodiments.

In some embodiments, beta patterns T1a' and T1b' and beta patterns T2a' and T2b' are formed in the peripheral region A2 shown in FIG. 7. The beta patterns T1a', T1b', T2a' and T2b' are similar to the beta patterns T1a, T1b, T2a and T2b, and the apostrophe mark indicates different embodiments for a purpose of ease of illustration but not intends to limit the present disclosure. In some embodiments, widths W1a', W1a" and W1a''' at different positions on the Y direction of the beta pattern T1a' are measured and compared. In some embodiments, a roughness of a boundary B1a' of the beta pattern T1a' is obtained and compared to the roughness of the boundary B1. In some embodiments, the roughness of the boundary B1a' is greater than the roughness of the boundary B1 of the reference pattern R1 shown in FIG. 5. In some embodiments, if such comparison yields a difference that exceeds a tolerance, it is determined the photomask substrate PS1 fails the inspection and a defect of roughness is detected. In some embodiments, the tolerance is within ±3 nm which is defined by the maximum difference of edge contour on the single edge side. In some embodiments, the tolerance can be adjusted depending on different applications, and it is not limited herein.

In some embodiments, the misalignment of the radiation shots P1a' occurs along the Y direction indicates the presence of radiation drift in the X direction. In some embodiments, the roughness of boundary B1a' represents degradation or contamination of a shaping deflector of the mask writer. In some embodiments, the shaping deflector is replaced or cleaned if the defect of roughness is detected. The alignment of the radiation shots P1a' along the Y direction is thereby adjusted or improved.

According to the above illustration and the operations O105 and O106, the alignment of the radiation shots P1a' is adjusted if a result of the comparison exceeds the tolerance; however, if the result of the comparison is within the tolerance, a photomask is formed subsequently. The formations of the beta and reference patterns and the comparison can be repeatedly performed until the photomask substrate PS1 passes the inspection (i.e. the difference of the roughness of the reference pattern and the beta pattern is within the tolerance). Since the inspection is performed at one or more early stages of a photomask fabrication (detailed illustration for fabricating the photomask is introduced later in the specification), defects on the photomask can be prevented.

In some embodiments, a width W1b' the beta pattern T1b' shown in FIG. 7 is less than the width W1 of the reference pattern R1 shown in FIG. 5. In some embodiments, a plurality of widths W1b' are measured at different positions of the beta pattern T1b', and a roughness of a boundary B1b' is low. In some embodiments, a roughness of the boundary B1b' of the beta pattern T1b' is similar to or substantially equal to the roughness of the boundary B1 of the reference pattern R1. That is, radiation shots P1b emitted to form the beta pattern T1b' are homogenously or generally too weak to form a pattern with a width substantially equal to the width W1 of the reference pattern R1. In some embodiments, if a difference between the width W1b' and the width W1 exceeds a tolerance, it is determined that the photomask substrate PS1 fails the inspection and a defect of homo-small is detected.

In some embodiments, the tolerance is equal to 1% of the width W1 of the reference pattern R1. In some embodiments, the tolerance is equal to 5% of the width W1 of the reference pattern R1. In some embodiments, the tolerance is equal to 0.05% of the width W1 of the reference pattern R1. In some embodiments, the tolerance is an absolute value instead of a percentage of the width W1. In some embodiments, the tolerance is 2 nm, and the acceptable range of the width W1b' of the beta patterns is within ±2 nm of the width W1 of the reference pattern R1. In some embodiments, the tolerance is equal to 5 nm, and the acceptable range of the width W1b' of the beta patterns is within ±5 nm of the width W1 of the reference pattern R1. The tolerance can be adjusted depending on different applications, and it is not limited herein.

In some embodiments, the homo-small width W1b' indicates that the radiation shots P1b' emitted on the photomask substrate PS1 have insufficient radiation energies. In some embodiments, an exposure time of the radiation shot P1b' is increased if the defect of homo-small width W1b' of the beta pattern T1b' is detected. In some embodiments, a beam energy of the radiation shot P1b' is increased if the defect of homo-small width W1b' of the beta pattern T1b' is detected. Similarly, formation of another beta pattern and comparison of the widths can be repeatedly performed after the beam energy is adjusted until the photomask substrate PS1 passes the inspection (i.e. the difference of the widths is within the tolerance). Therefore, defects of a photomask can be prevented.

In some embodiments, a width W2a' of the beta pattern T2a' shown in FIG. 7 is greater than the width W2 of the reference pattern R2 shown in FIG. 5. In some embodiments, a plurality of widths are measured at different positions of the beta pattern T1b' are measured, and a roughness of a boundary B2a' is determined. In some embodiments, the roughness of a boundary B2a' of the beta pattern T2a' is similar to or substantially equal to the roughness of the boundary B2 of the reference pattern R2. That is, radiation shots P2a' emitted to form the beta pattern T2a' are homogenously or generally too strong to form a pattern with a width that is substantially equal to the width W2 of the reference pattern R2. In some embodiments, if a difference between the width W2a' and the width W2 exceeds a tolerance, it is determined that the photomask substrate PS1 fails the inspection and a defect of homo-large is detected.

In some embodiments, the homo-large width W2a' indicates that the radiation shots P2a' emitted on the photomask substrate PS1 have excessive radiation energies. In some embodiments, an exposure time of the radiation shot P1b is reduced if the defect of homo-large width W2a' of the beta pattern T2a' is detected. In some embodiments, a beam energy of the radiation shot P2a' is reduced if the defect of homo-large width W2a' of the beta pattern T2a' is detected.

Similarly, formation of another beta pattern and comparison of the widths can be repeatedly performed after the beam energy is adjusted until the photomask substrate PS1 passes the inspection (i.e. the difference of the widths is within the tolerance). Therefore, defects of a photomask can be prevented.

In the above-illustrated embodiments, the beta patterns T1a', T1b' and T2a' of FIG. 7 respectively show different types of defects. In some embodiments, a combination of different types of defects can occur.

In some embodiments, as shown in the beta pattern T2b' in FIG. 7, widths W2b', W2b'' and W2b''' measured at different positions of the beta pattern T2b' are generally too small compared to the width W2 of the reference pattern R2. In addition, a roughness of a boundary B2b' of the beta pattern T2b' is greater than the roughness of the boundary B2 of the reference pattern R2 shown in FIG. 5.

In some embodiments, the misalignment of the radiation shots P2b' occurs along the X direction indicates the presence of radiation drift in the Y direction. In some embodiments, the roughness of the boundary B2b' represents degradation or contamination of a shaping deflector of the mask writer, and the homo-small widths W2b', W2b'' and W2b''' indicates radiation energies of the radiation shots P2b' emitted on the photomask substrate PS1 are generally too weak. In some embodiments, the shaping deflector is replaced or cleaned if the defect of roughness is detected, and an exposure time of the radiation shot P2b' is increased if the defect of homo-small of the beta pattern T2b' is detected. Similarly, formation of another beta pattern and comparisons of the widths and the roughnesses and adjustments of the beam energy and the alignment of the radiation shots P2b' can be repeatedly performed until the photomask substrate PS1 passes the inspection (i.e. the difference of the widths and the difference of the roughnesses are both within the respective tolerance). Therefore, defects of a photomask can be prevented.

Figure 8:
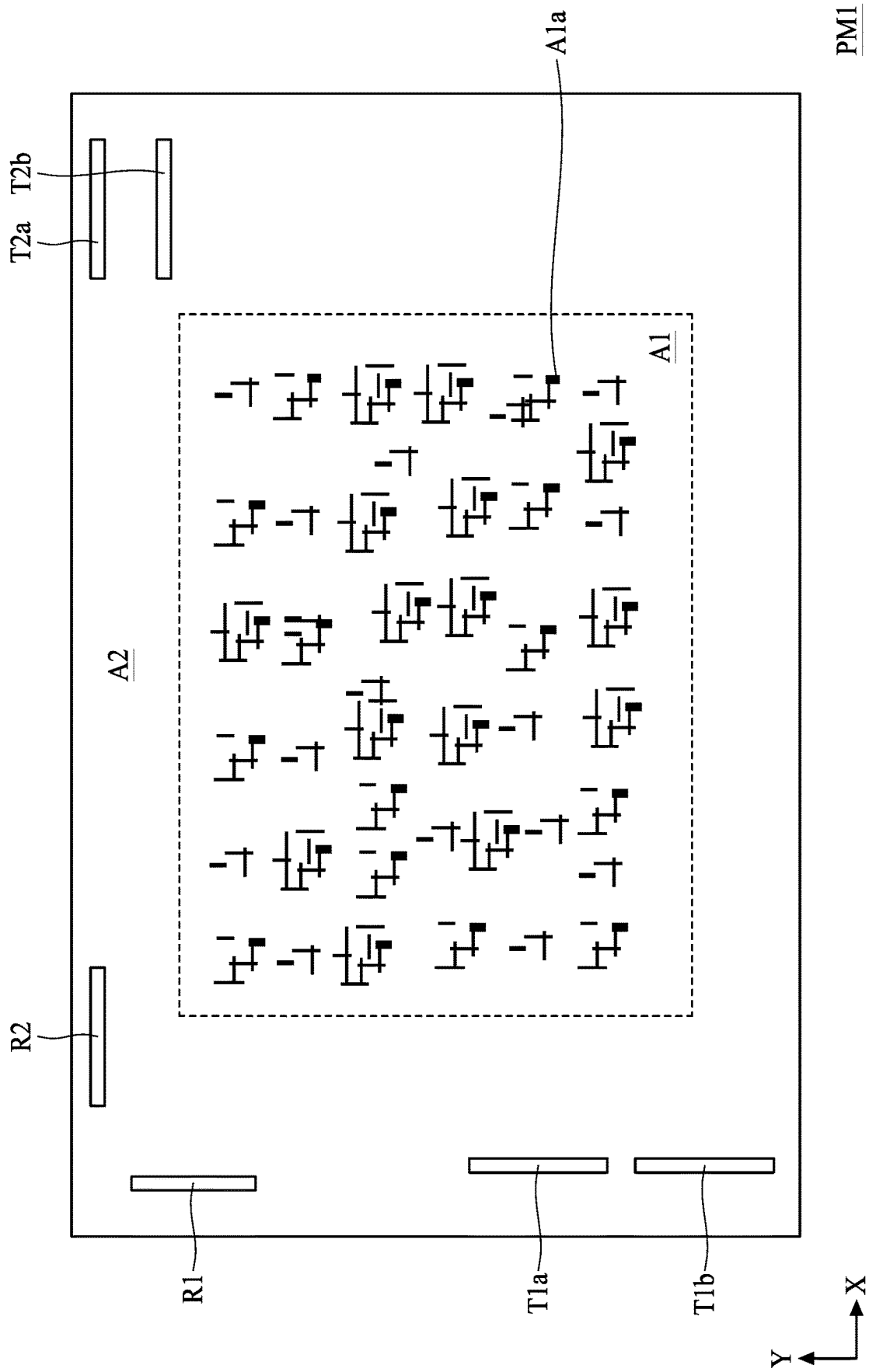
FIGS. 8 to 10 are top views of photomasks in accordance with some embodiments of the present disclosure.
Figure 9:
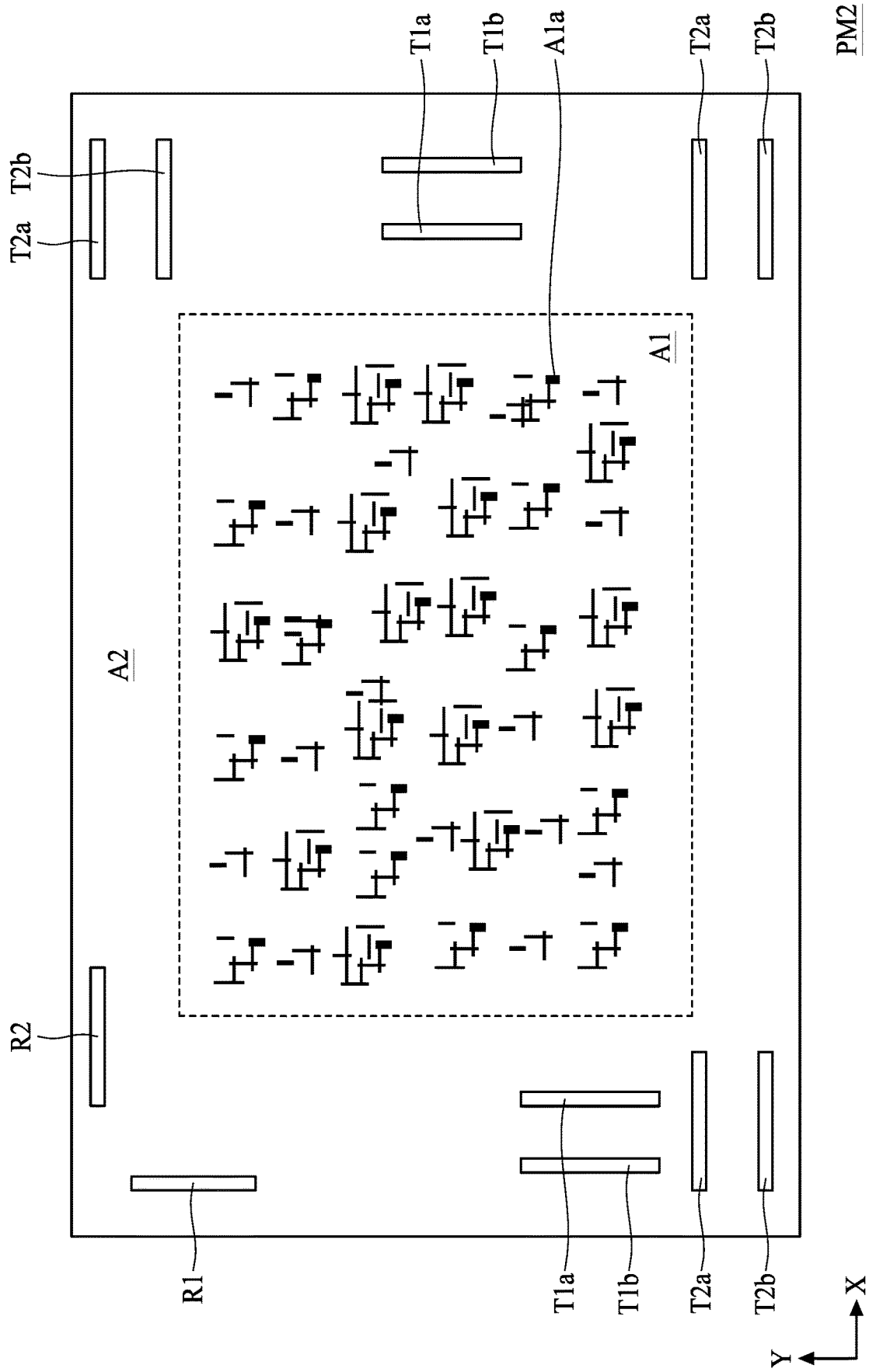
Figure 10:
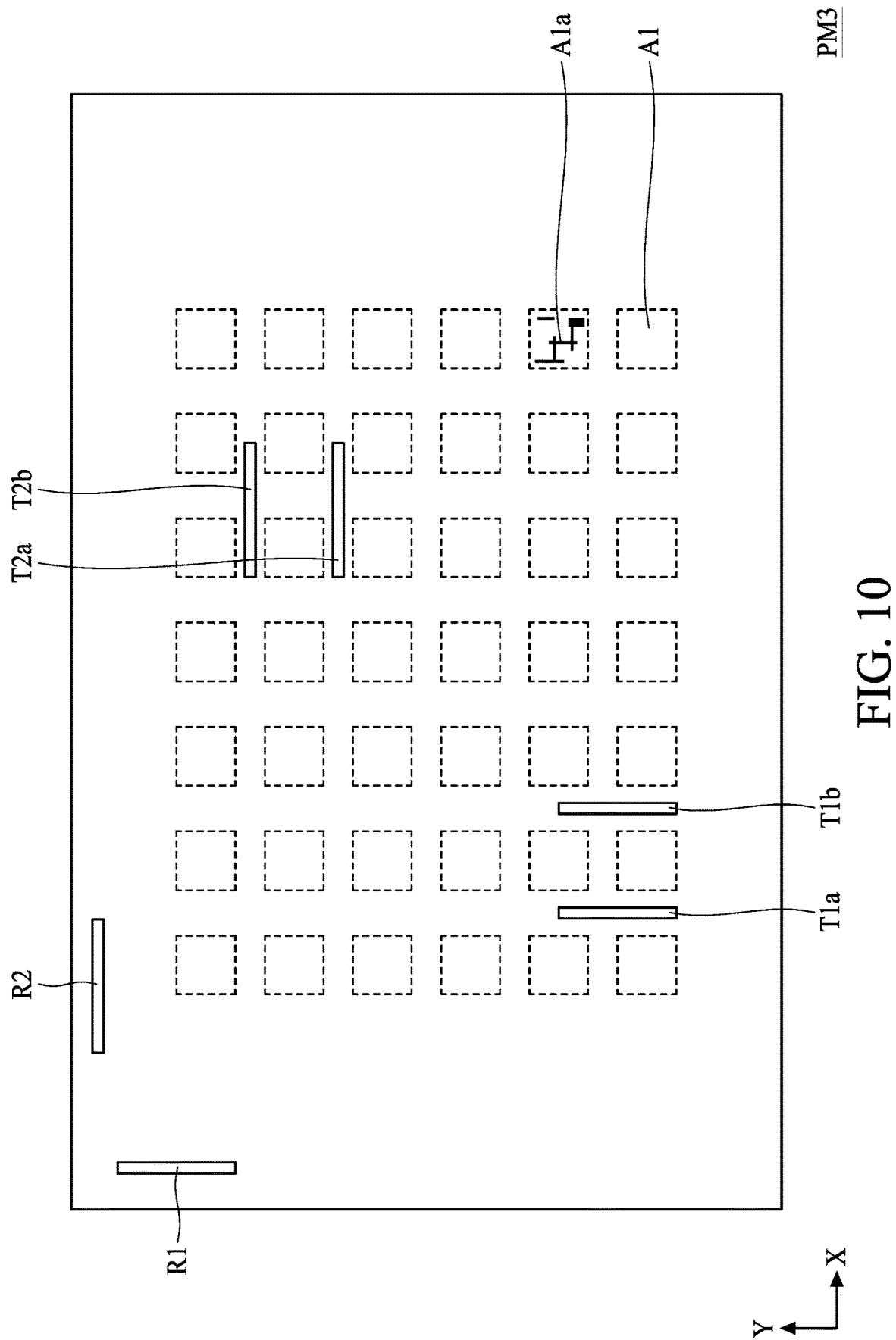

Locations and numbers of the reference patterns and the beta patterns are not limited herein as long as the reference patterns and the beta patterns are in the peripheral region A2 of a photomask substrate. In some embodiments as shown in FIG. 8, only each of reference patterns R1 and R2 and each of beta patterns T1a, T1b, T2a and T2b are formed in the peripheral region A2 of a photomask PM1. In some embodiments, defects of the mask writer tend to occur repeatedly across a photomask substrate and it is not necessary to form several of the same beta patterns and/or reference patterns. In some embodiments as shown in FIG. 9, multiple beta patterns T1a/T1b/T2a/T2b are formed across a photomask PM2. In some embodiments, different defects can be examined if performance of the mask writer is unstable across a photomask substrate. In some embodiments as shown in FIG. 10, the beta patterns T1a/T1b/T2a//T2b are formed between design patterns A1a and between chip regions A1 of a photomask PM3. Only some chip regions A1 include the design patterns are shown in FIG. 10 for a purpose of simply illustration. In some embodiments, every of the chip regions A1 includes same or different design patterns A1a.

In some embodiments as shown in FIGS. 8 to 10, the method M10 further includes forming the design pattern A1a in the chip region A1. In some embodiments, the operations O102 and O103 are performed concurrently. In some embodiments, operation O102 is performed after or prior to the operation O103. In some embodiments, the operations O102 and O103 are performed concurrently with, prior to, or after the formation of the design pattern A1a. In some embodiments, the design pattern A1a is formed after the photomask substrate passes the inspection, and then the patterns (including reference patterns, passed beta patterns, and the design patterns) are transferred to one or more layers underlying a photoresist layer of the photomask substrate. The order of the operations can depend on the fabrication and the mask writer, and it is not limited herein. Moreover, in some embodiments, an extra exposure time for forming the reference patterns and the beta patterns can be limited in less than 10 minutes. The extra exposure time should be short in comparison to an exposure time for forming the design pattern A1a due to simple configurations and large scales of the reference patterns and the beta patterns relative to the design pattern A1a.

Similarly, in some embodiments, the operation O203 of the method M20 is performed concurrently with the operation O204. In some embodiments, the operation O203 of the method M20 is performed after, prior to or concurrently with the operation O204. In some embodiments, formation of the reference patterns and formation of the beta patterns are performed concurrently in one writing procedure. In some embodiments, formation of the reference patterns is performed prior to or after formation of the beta patterns.

Therefore, different longitudinal directions of the reference patterns R1 and R2 and the beta patterns T1a/T1a' and T2b/T2b' can provide inspection results corresponding to different shaping deflector (e.g., X-direction deflector or Y-direction deflector). Moreover, different directions of alignment of the radiation shots for forming the beta patterns respectively can facilitate detection of different types of defects. The method for fabricating a photomask provided by the present disclosure provides detailed examinations under various conditions, and a product yield can be improved.

In order to detect defects of a photomask in an early stage of the fabrication, the comparing operation or the inspection can be performed after formation of a patterned photoresist layer.

FIGS. 11 to 16 are cross-sectional diagrams illustrating different stages of fabrication of a super binary mask (SBIM) in accordance with some embodiments of the present disclosure. For ease of illustration, FIGS. 11 to 16 show a portion of a photomask substrate and formation of the beta patterns T2a and T2b, but it is not intended to limit the following process of the present disclosure to the beta patterns T2a and T2b.

Figure 11:
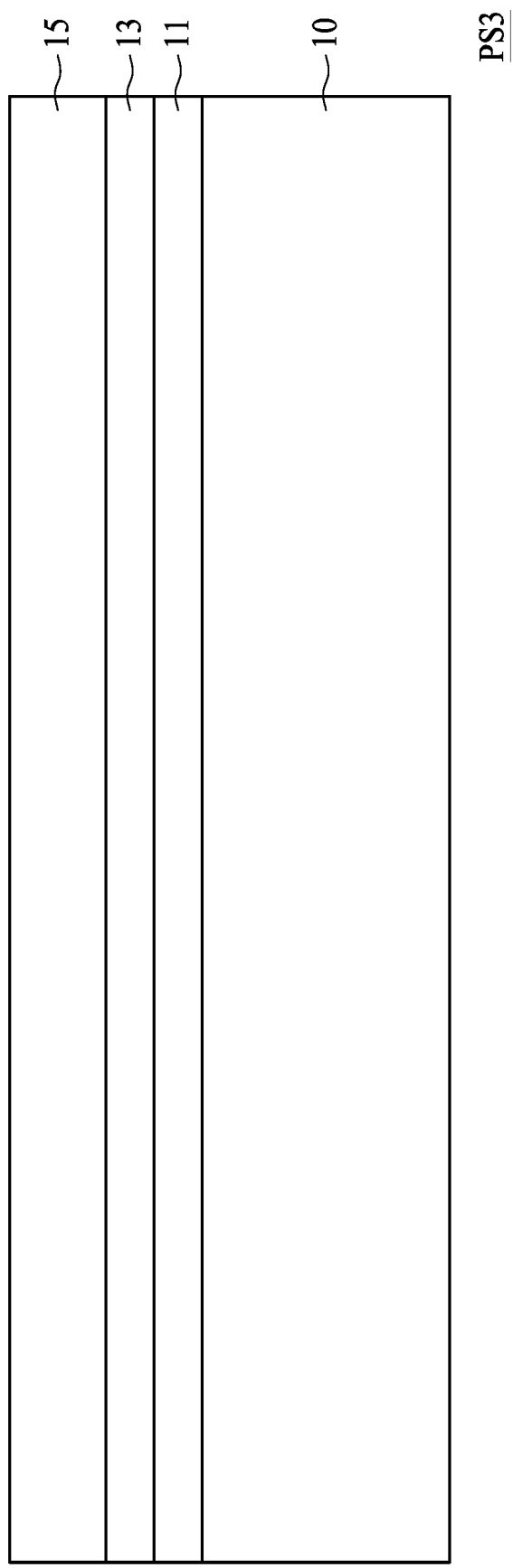
FIGS. 11 to 16 are cross-sectional diagrams of photomask substrates at various stages of a method in accordance with some embodiments of the present disclosure.

Referring to FIG. 11, a photomask substrate PS3 is received. The photomask substrate PS3 includes a carrier layer 10, a shielding layer 11 over the carrier layer 10, and a hard layer 13 over the shielding layer 11. In some embodiments, a photoresist layer 15 is formed over the hard layer 13 of the photomask substrate PS3. In some embodiments, the photoresist layer 15 includes a positive photoresist. In some embodiments, the carrier layer 10 is transparent. In some embodiments, the carrier layer 10 includes at least one of quartz and glass. In some embodiments, the shielding layer 11 includes molybdenum silicide (MoSi). In some embodiments, the hard layer 13 includes chromium (Cr).

Figure 12:
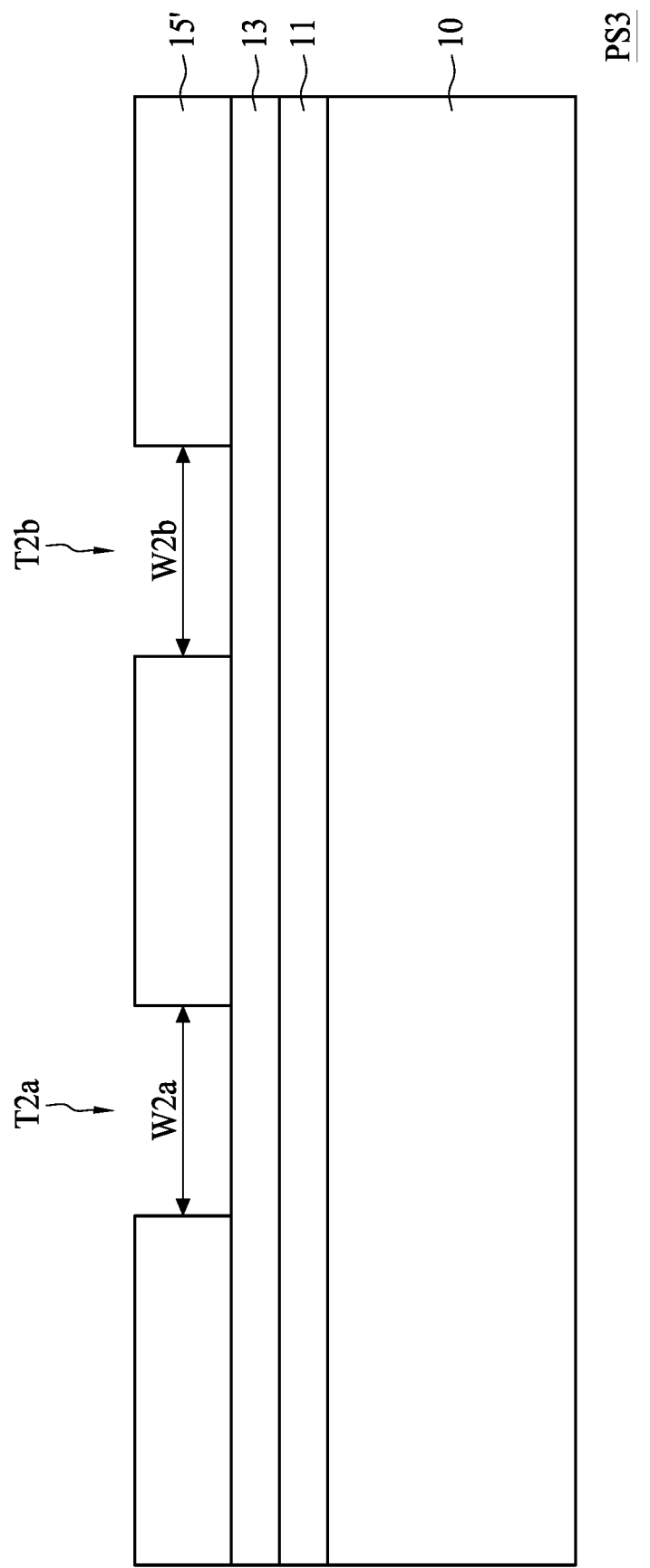

Referring to FIG. 12, the photoresist layer 15 is patterned thereby forming a patterned photoresist layer 15'. In some embodiments, a lithographic operation (or writing operation) including emitting the radiation shots P1, P2, P1a, P1b, P2a and P2b is performed to form the patterned photoresist layer 15'. In some embodiments, the patterned photoresist layer 15' includes the reference patterns, the beta patterns and the design patterns. In some embodiments, the comparing operation (the operation O104 or O205) is performed after the formation of the patterned photoresist layer 15' and before patterning of the hard layer 13 or proceeding to a next operation. In some embodiments, the fabrication is suspended if the photomask substrate PS3 fails the inspection, and proceeds if the photomask substrate PS3 passes the inspection. In some embodiments with positive photoresist layer 15, the reference patterns and the beta patterns include spaces between portions of the patterned photoresist layer 15'. The positive photoresist is a type of photoresist in which portions of the photoresist exposed to light become soluble to a photoresist developer, and thus spaces formed after a development of the lithographic operation is critical. In some embodiments, the roughness of the boundaries and the widths of the reference patterns and the beta patterns are determined by measuring widths of the spaces between the portions of the patterned photoresist layer 15'. If the inspection fails at the stage shown in FIG. 12, the patterned photoresist layer 15' is removed and the operations shown in FIGS. 11 to 12 are repeated.

Figure 13:
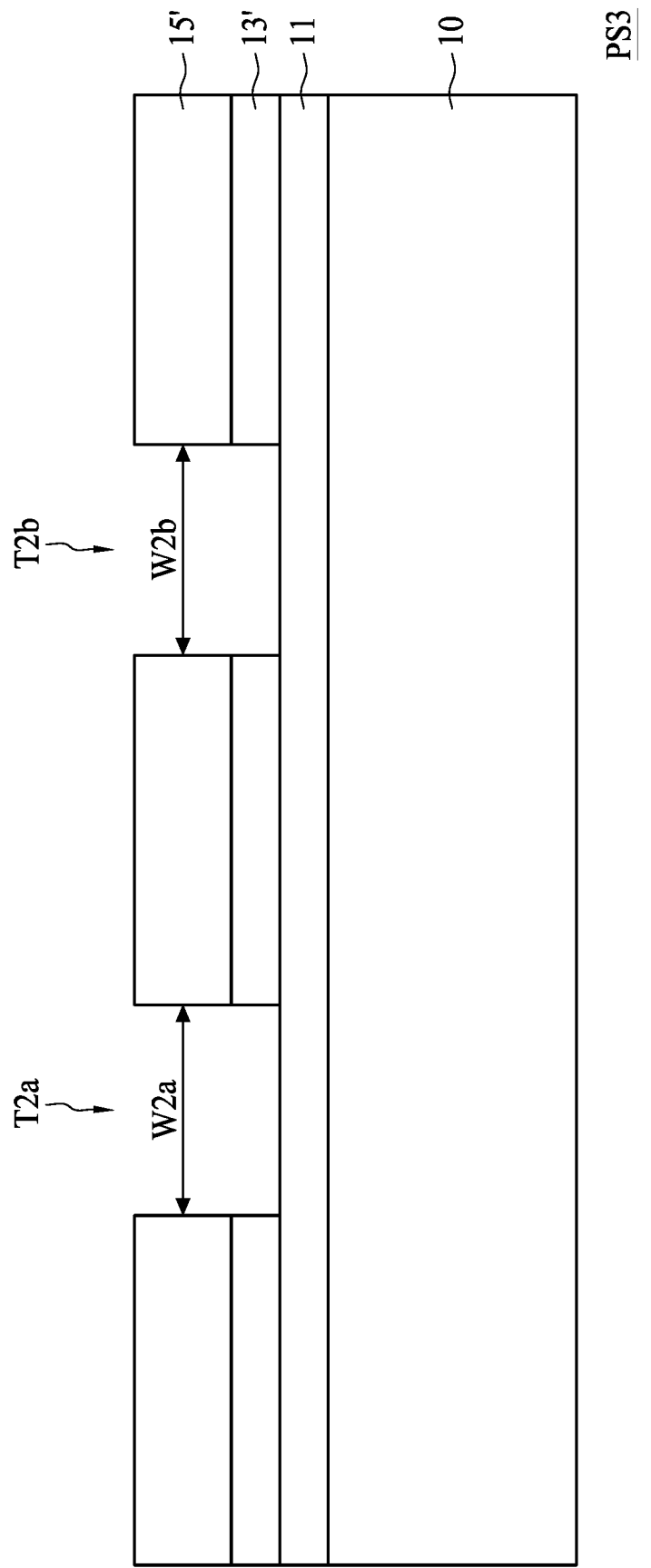

Referring to FIG. 13, the reference patterns, the beta patterns (e.g., T2a and T2b) and the design patterns are transferred to the hard layer 13. In some embodiments, portions of the hard layer 13 are removed through the patterned photoresist layer 15' to form a patterned hard layer 13'. In some embodiments, the comparing operation (the operation O104 or O205) is performed after formation of the patterned hard layer 13' and before removal of the patterned photoresist layer 15' or proceeding to a next operation. In some embodiments, the fabrication is suspended if the photomask substrate PS3 fails the inspection, and proceeds if the photomask substrate PS3 passes the inspection.

Figure 14:
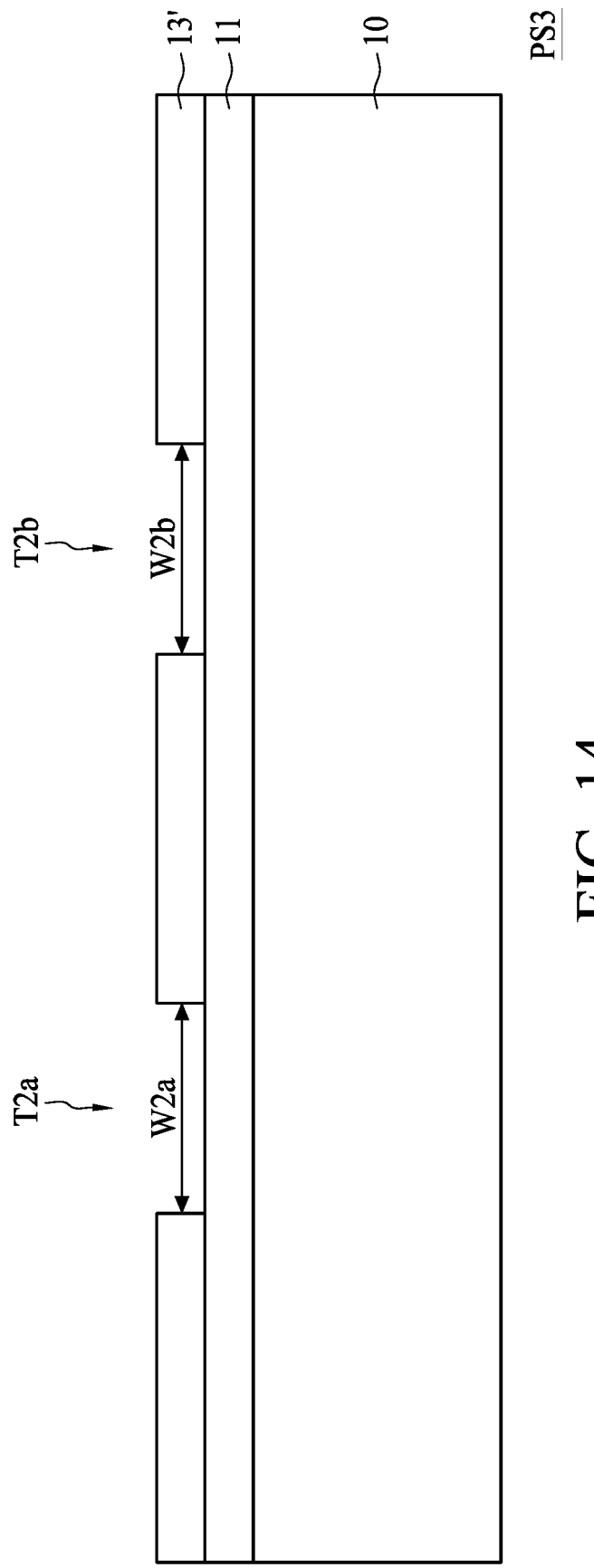

Referring to FIG. 14, the patterned photoresist layer 15' is removed. In some embodiments, the patterned hard layer 13' includes the reference patterns, the beta patterns and the design patterns. In some embodiments, the comparing operation (the operation O104 or O205) is performed after removal of the patterned photoresist layer 15' and before patterning of the shielding layer 11 or proceeding to a next operation. In some embodiments using the positive photoresist layer 15, the roughness of the boundaries and the widths of the reference patterns and the beta patterns are determined by measuring widths of the spaces between portions of the patterned hard layer 13'. In some embodiments, the fabrication is suspended if the photomask substrate PS3 fails the inspection, and proceeds if the photomask substrate PS3 passes the inspection.

Figure 15:
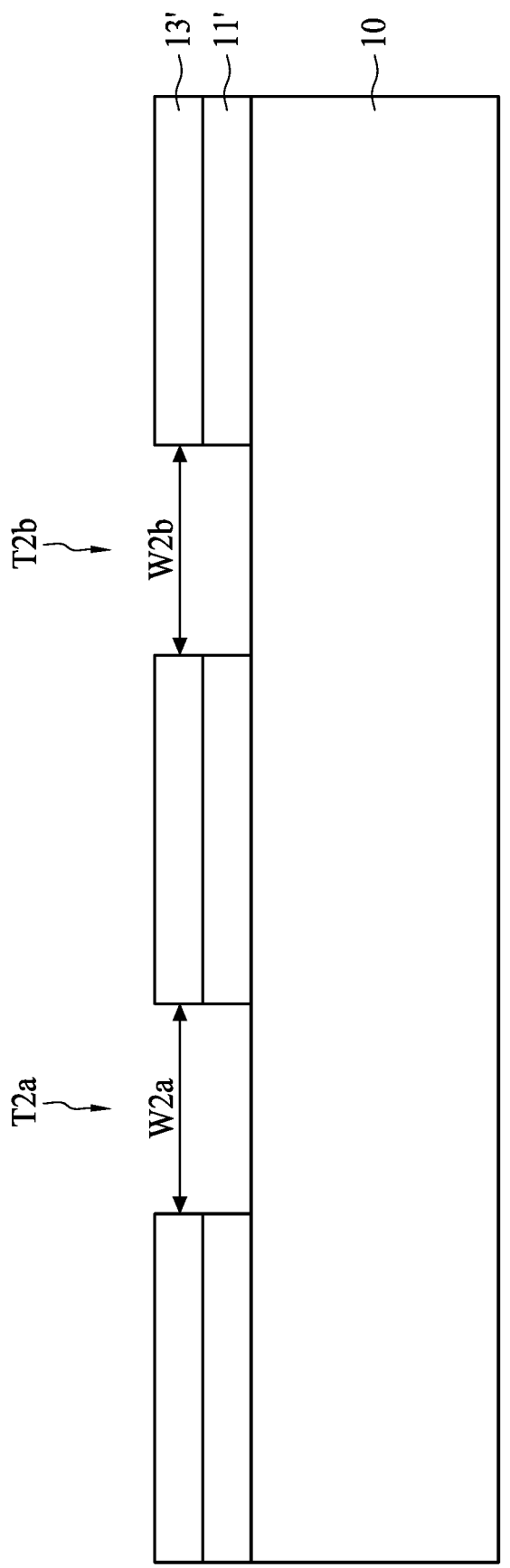

Referring to FIG. 15, the reference patterns, the beta patterns and the design patterns are transferred to the shielding layer 11. In some embodiments, the design pattern A1a is transferred to the shielding layer 11 concurrently with the reference patterns and the beta patterns if the photomask substrate PS3 passes the inspection. That is, in some embodiments, the design pattern is transferred to the shielding layer 11 if a difference between the roughness and/or the width of the beta pattern and a roughness and/or the width of the reference pattern is within a tolerance. In some embodiments, portions of the shielding layer 11 are removed through the patterned hard layer 13' to form a patterned shielding layer 11'. In some embodiments, the patterned shielding layer 11' includes the reference patterns, the beta patterns and the design patterns. In some embodiments, the correctness and quality of the design pattern of the patterned shielding layer 11' are ensured by performing the comparing operation prior to the formation of the patterned shielding layer 11'.

Figure 16:
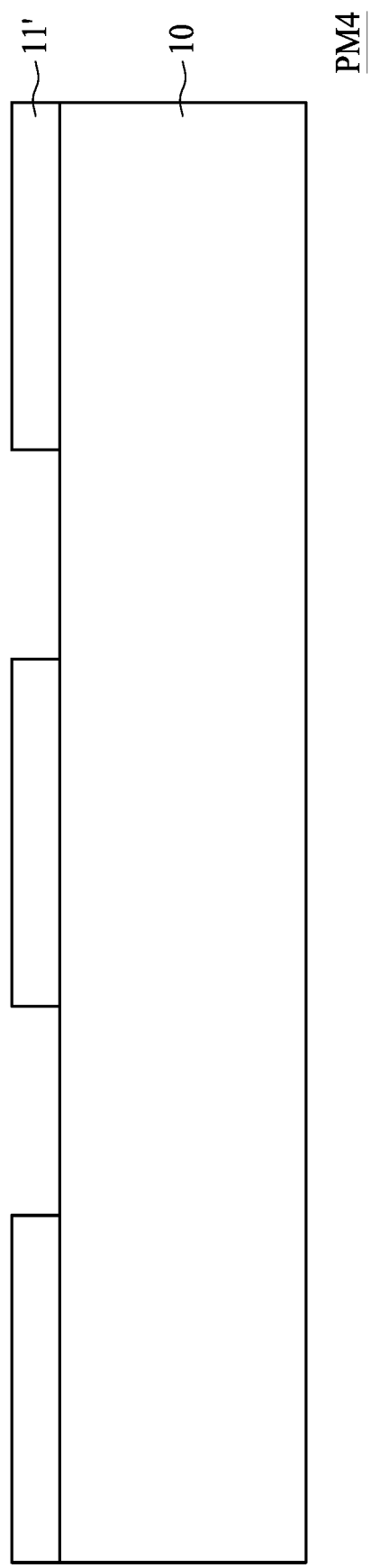

Referring to FIG. 16, the patterned hard layer 13' is removed, thereby forming a photomask PM4. In some embodiments, a pattern of the patterned shielding layer 11' is the pattern of a photomask PM4.

Figure 17:
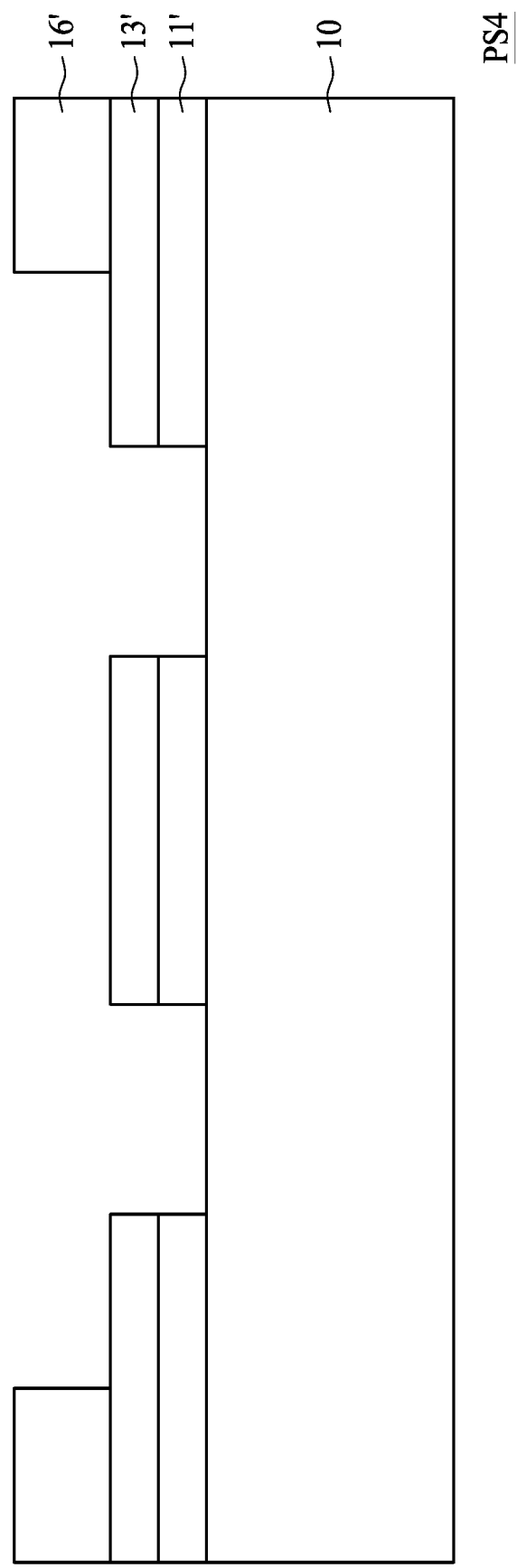
FIGS. 17 to 18 are cross-sectional diagrams of photomask substrates at various stages of a method in accordance with some embodiments of the present disclosure.
Figure 18:
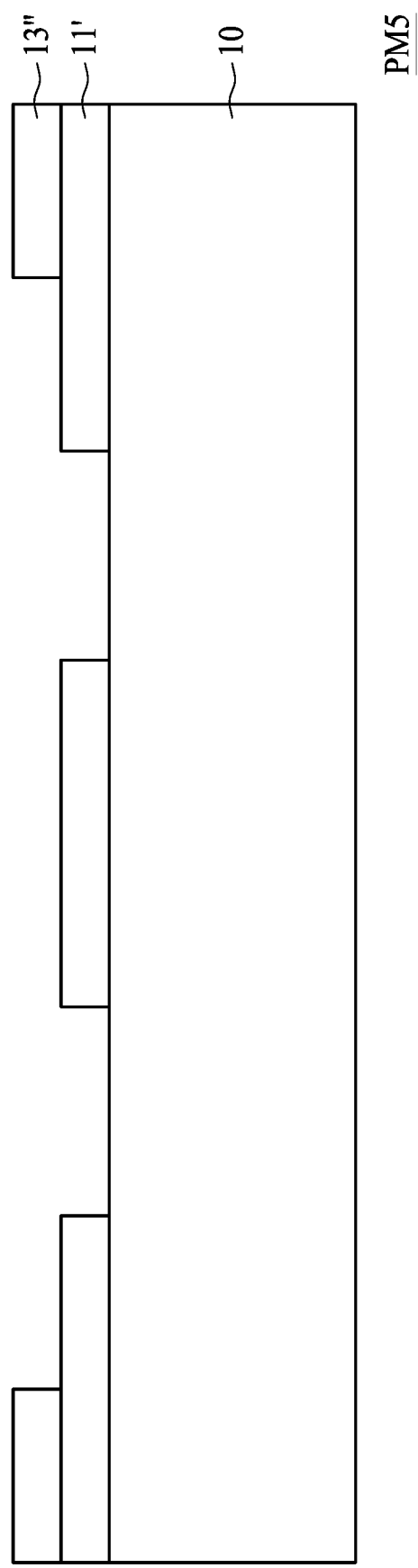

The method M10 can be applied on various types of photomasks. FIGS. 17 to 18 are cross-sectional diagrams illustrating different stages of fabrication of an alternating phase-shift mask (APSM) using a positive photoresist in accordance with some embodiments of the present disclosure. FIGS. 17 to 18 show only a portion of a photomask substrate and formation of the beta patterns T2a and T2b, but it is not intended to limit the following process of the present disclosure to the beta patterns T2a and T2b.

Referring to FIG. 17, a photomask substrate PS4 is received. Operations similar to those illustrated in FIGS. 11 to 15 are performed to form a patterned hard layer 13' and a patterned shielding layer 11'. Another patterned photoresist layer 16' is formed on the patterned hard layer 13'. In some embodiments, the comparing operation can be performed prior to patterning the patterned hard layer 13'. Referring to FIG. 18, portions of the patterned hard layer 13' are removed through the patterned photoresist layer 16' to form a patterned hard layer 13". The patterned photoresist layer 16' is then removed to form a photomask PM5.

In some embodiments, the photoresist layer 15 includes a negative photoresist. FIGS. 19 to 28 are cross-sectional diagrams illustrating different stages of fabrication of an APSM using a negative photoresist in accordance with some embodiments of the present disclosure. FIGS. 19 to 28 show only a portion of a photomask substrate and formation of the beta patterns T2a and T2b, but it is not intended to limit the following process of the present disclosure to the beta patterns T2a and T2b.

Figure 19:
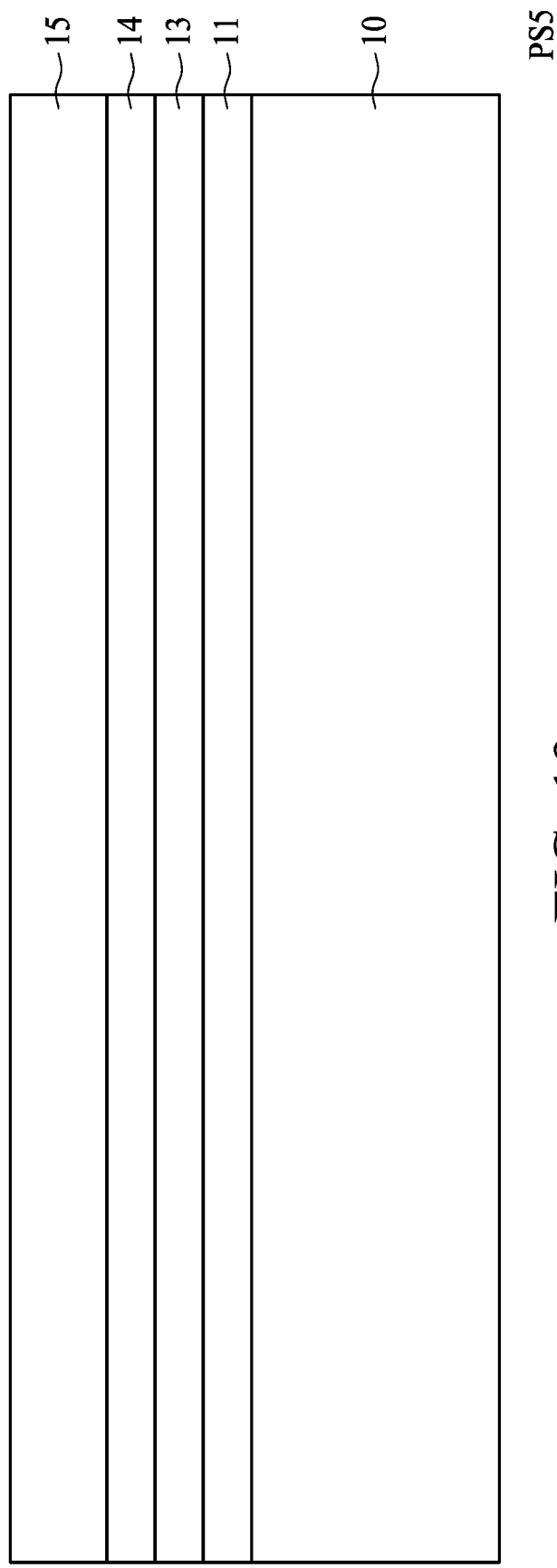
FIGS. 19 to 28 are cross-sectional diagrams of photomask substrates at various stages of a method in accordance with some embodiments of the present disclosure.

Referring to FIG. 19, a photomask substrate PS5 is received. The photomask substrate PS5 includes a carrier layer 10, a shielding layer 11 over the carrier layer 10, a hard layer 13 over the shielding layer 11, a mask layer 14 over the hard layer 13, and a photoresist layer 15 over the mask layer 14. In some embodiments, the photoresist layer 15 includes a negative photoresist. In some embodiments, the carrier layer 10 is transparent. In some embodiments, the carrier layer 10 includes at least one of quartz and glass.

Figure 20:
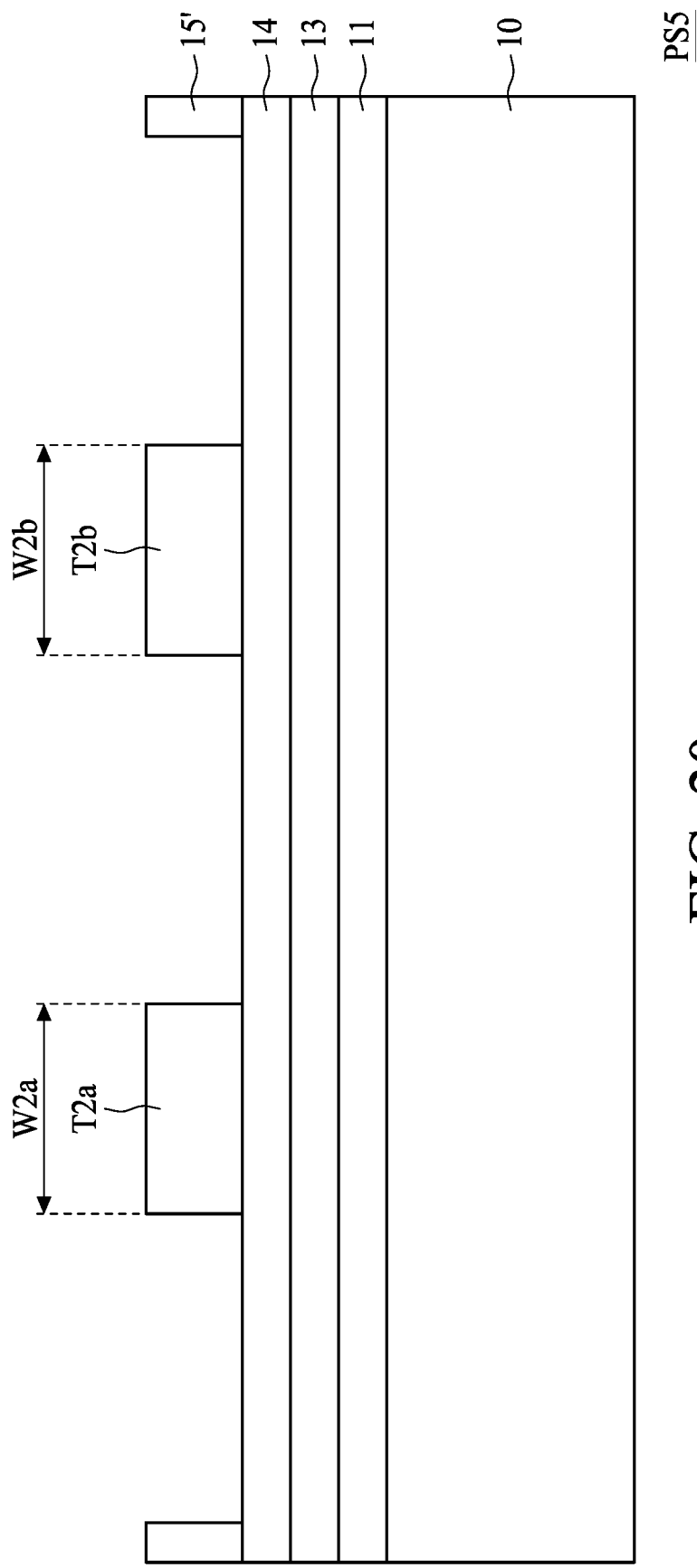

Referring to FIG. 20, the photoresist layer 15 is patterned, thereby forming a patterned photoresist layer 15'. In some embodiments, a lithographic operation (or writing operation) including emitting the radiation shots P1, P2, P1a, P1b, P2a and P2b is performed to form the patterned photoresist layer 15'. In some embodiments, the patterned photoresist layer 15' includes the reference patterns, the beta patterns and the design patterns. In some embodiments, the comparing operation (the operation O104 or O205) is performed after the formation of the patterned photoresist layer 15' and before patterning of the mask layer 14 or proceeding to a next operation. In some embodiments, the fabrication is suspended if the photomask substrate PS5 fails the inspection, and proceeds if the photomask substrate PS5 passes the inspection. In some embodiments with negative photoresist, the reference patterns and the beta patterns include portions of the patterned photoresist layer 15'. The negative photoresist is a type of photoresist in which portions of the photoresist exposed to light become insoluble to a photoresist developer, and unexposed portions of the photoresist is dissolved by the photoresist developer. In some embodiments, the roughness of the boundaries and the widths of the reference patterns and the beta patterns are determined by measuring widths of the portions of the patterned photoresist layer 15'.

Figure 21:
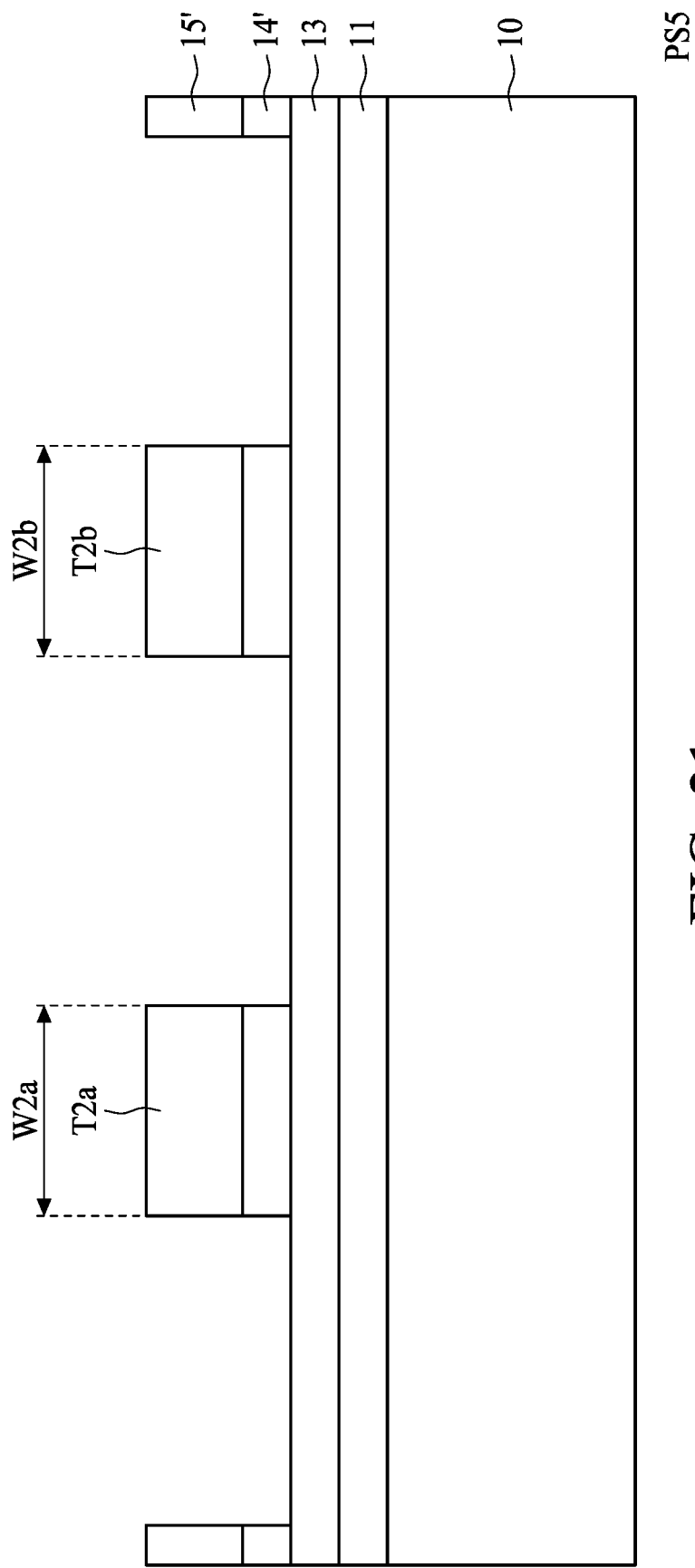

Referring to FIG. 21, the reference patterns, the beta patterns (e.g., T2a and T2b) and the design patterns are transferred to the mask layer 14. In some embodiments, portions of the mask layer 14 are removed through the patterned photoresist layer 15' to form a patterned mask layer 14'. In some embodiments, the comparing operation (the operation O104 or O205) is performed after formation of the patterned mask layer 14' and before removal of the patterned photoresist layer 15' or proceeding to a next operation. In some embodiments, the fabrication is suspended if the photomask substrate PS5 fails the inspection, and proceeds if the photomask substrate PS5 passes the inspection.

Figure 22:
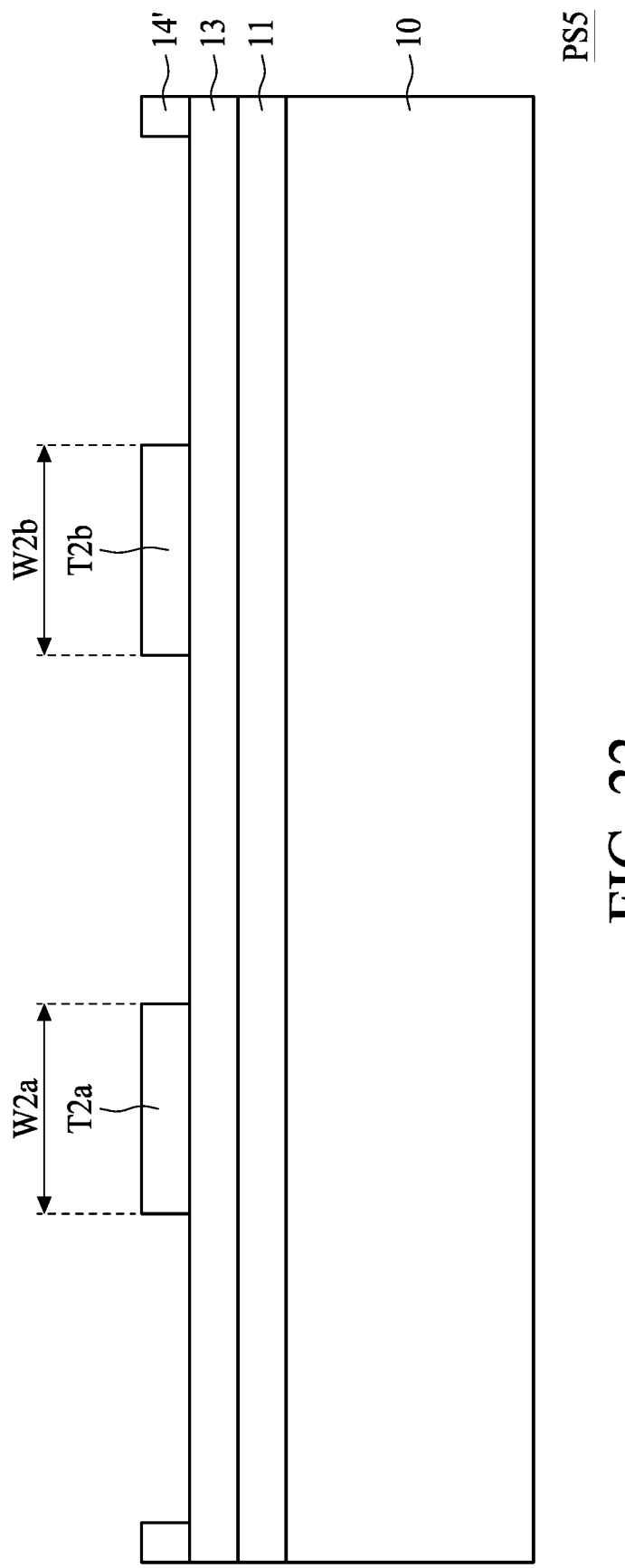

Referring to FIG. 22, the patterned photoresist layer 15' is removed. In some embodiments, the patterned mask layer 14' includes the reference patterns, the beta patterns and the design patterns. In some embodiments, the comparing operation (the operation O104 or O205) is performed after removal of the patterned photoresist layer 15' and before patterning of the hard layer 13 or proceeding to a next operation. In some embodiments, the comparing operation is performed prior to removal of the patterned mask layer 14'. In some embodiments using the negative photoresist layer 15, the roughness of the boundaries and the widths of the reference patterns and the beta patterns are determined by measuring widths of portions of the patterned mask layer 14'. In some embodiments, the fabrication is suspended if the photomask substrate PS5 fails the inspection, and proceeds if the photomask substrate PS5 passes the inspection.

Figure 23:
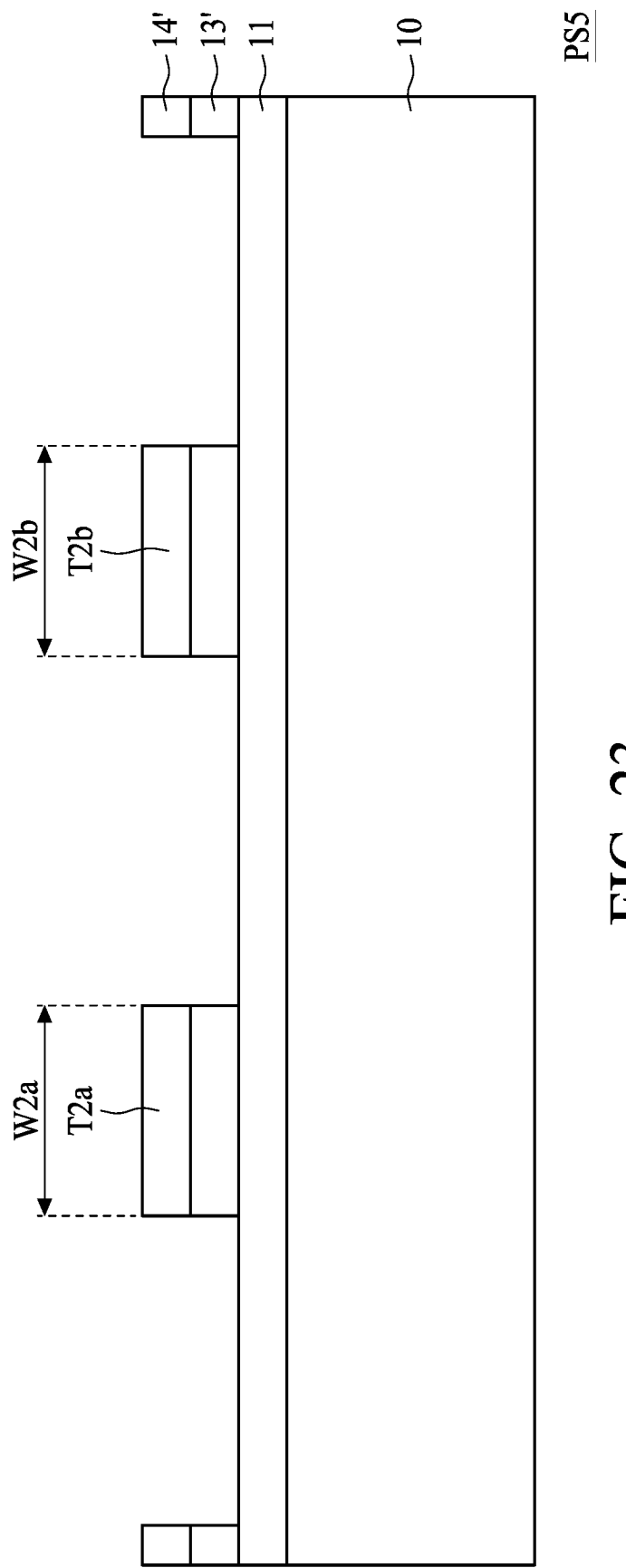

Referring to FIG. 23, the reference patterns, the beta patterns (e.g., T2a and T2b) and the design patterns are transferred to the hard layer 13. In some embodiments, portions of the hard layer 13 are removed through the patterned mask layer 14' to form a patterned hard layer 13'. In some embodiments, the comparing operation (the operation O104 or O205) is performed after formation of the patterned hard layer 13' and before removal of the patterned mask layer 14' or proceeding to a next operation. In some embodiments, the fabrication is suspended if the photomask substrate PS5 fails the inspection, and proceeds if the photomask substrate PS5 passes the inspection.

Figure 24:
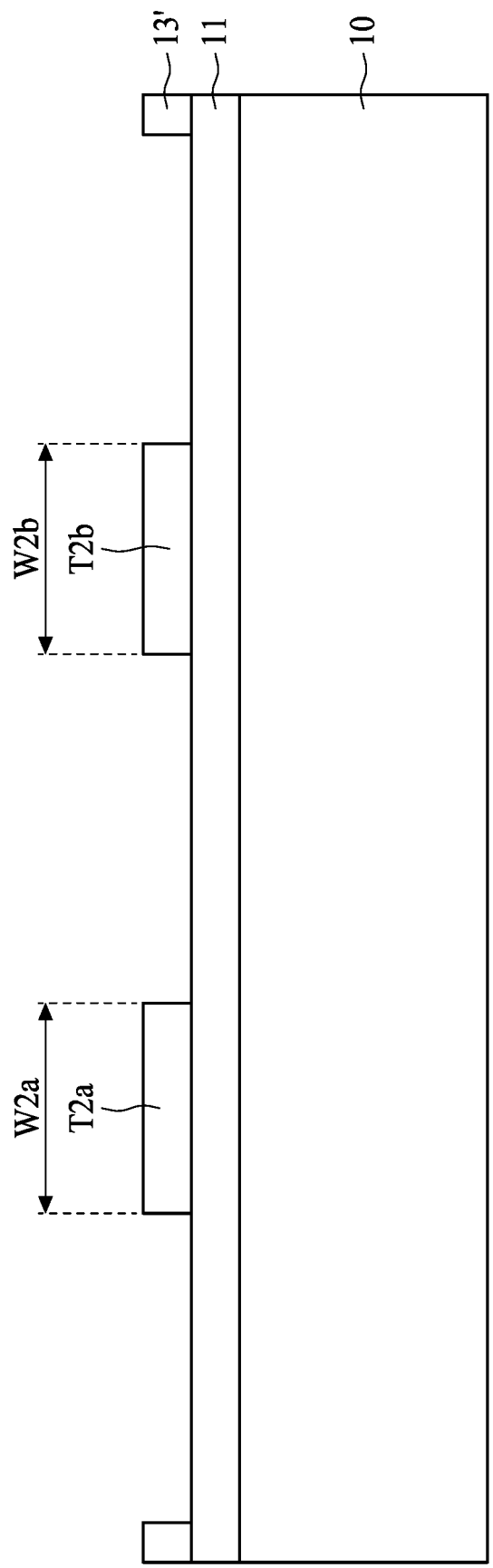

Referring to FIG. 24, the patterned mask layer 14' is removed. In some embodiments, the patterned mask layer 14' includes the reference patterns, the beta patterns and the design patterns. In some embodiments, the comparing operation (the operation O104 or O205) is performed after removal of the patterned mask layer 14' and before patterning of the shielding layer 11 or proceeding to a next operation. In some embodiments using the negative photoresist layer 15, the roughness of the boundaries and the widths of the reference patterns and the beta patterns are determined by measuring portions of the patterned hard layer 13'. In some embodiments, the fabrication is suspended if the photomask substrate PS5 fails the inspection, and proceeds if the photomask substrate PS5 passes the inspection.

Figure 25:
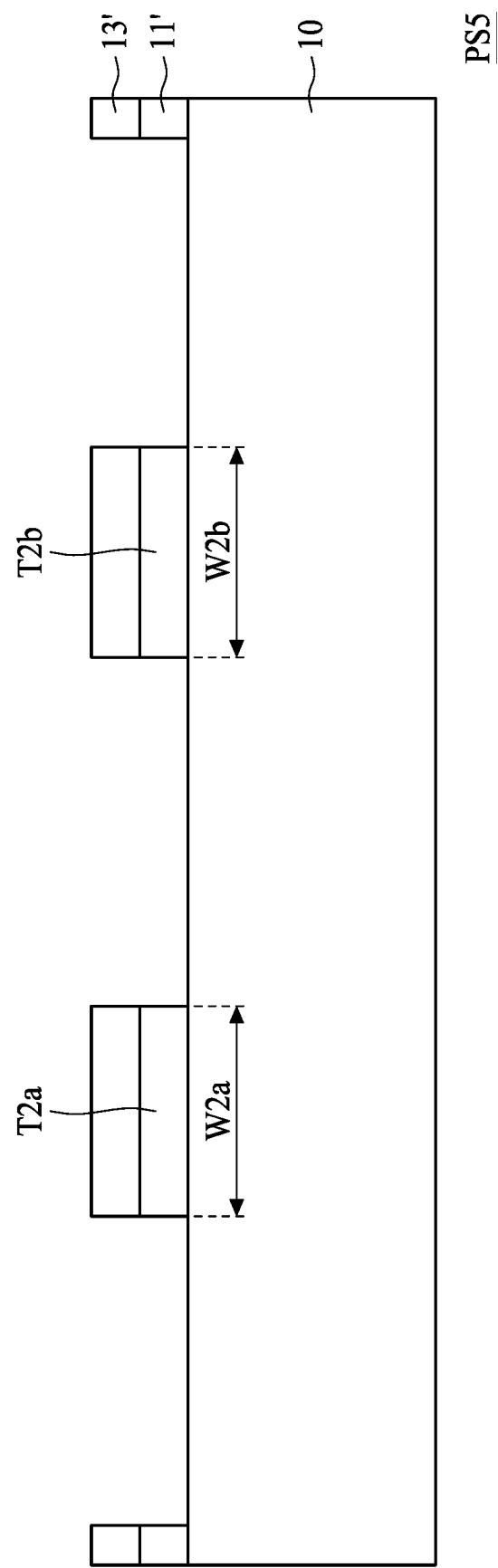

Referring to FIG. 25, the reference patterns, the beta patterns and the design patterns are transferred to the shielding layer 11. In some embodiments, the design pattern is transferred to the shielding layer 11 concurrently with the reference patterns and the beta patterns if the photomask substrate PS5 passes the inspection. That is, in some embodiments, the design pattern is transferred to the shielding layer 11 if a difference between the roughness and/or the width of the beta pattern and the roughness and/or the width of the reference pattern is within a tolerance. In some embodiments, portions of the shielding layer 11 are removed through the patterned hard layer 13' to form a patterned shielding layer 11'. In some embodiments, the patterned shielding layer 11' includes the reference patterns, the beta patterns and the design patterns. In some embodiments, the correctness and quality of the design pattern of the patterned shielding layer 11' are ensured by performing the comparing operation prior to formation of the patterned shielding layer 11'.

Figure 26:
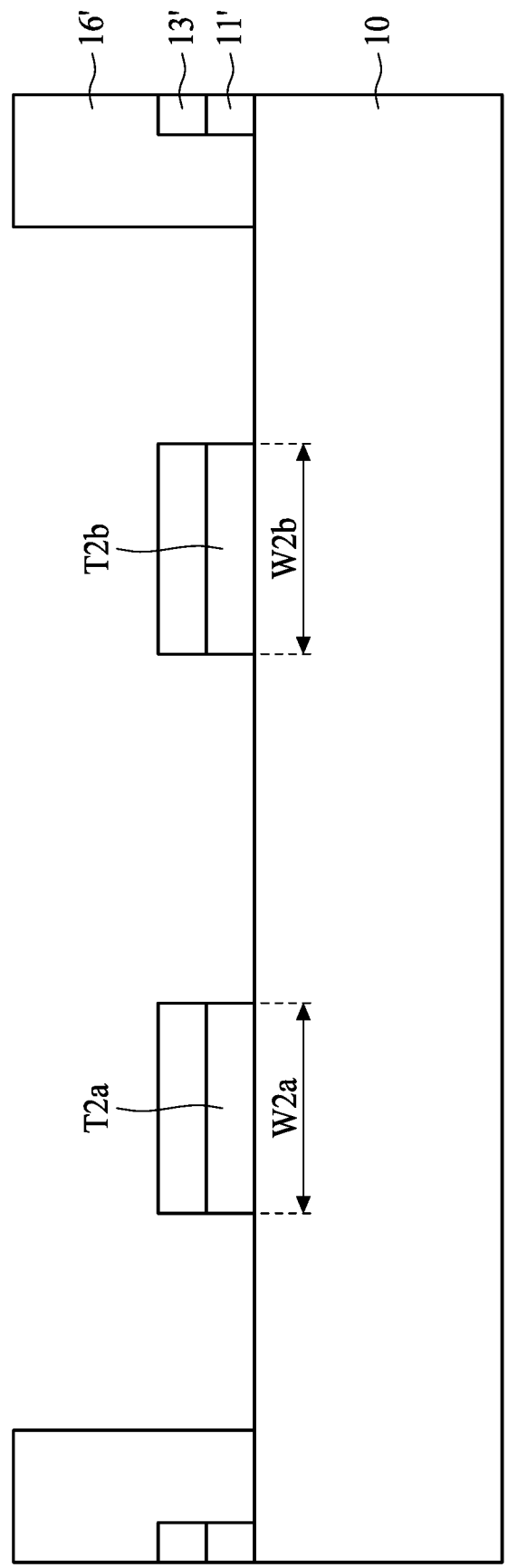
Figure 27:
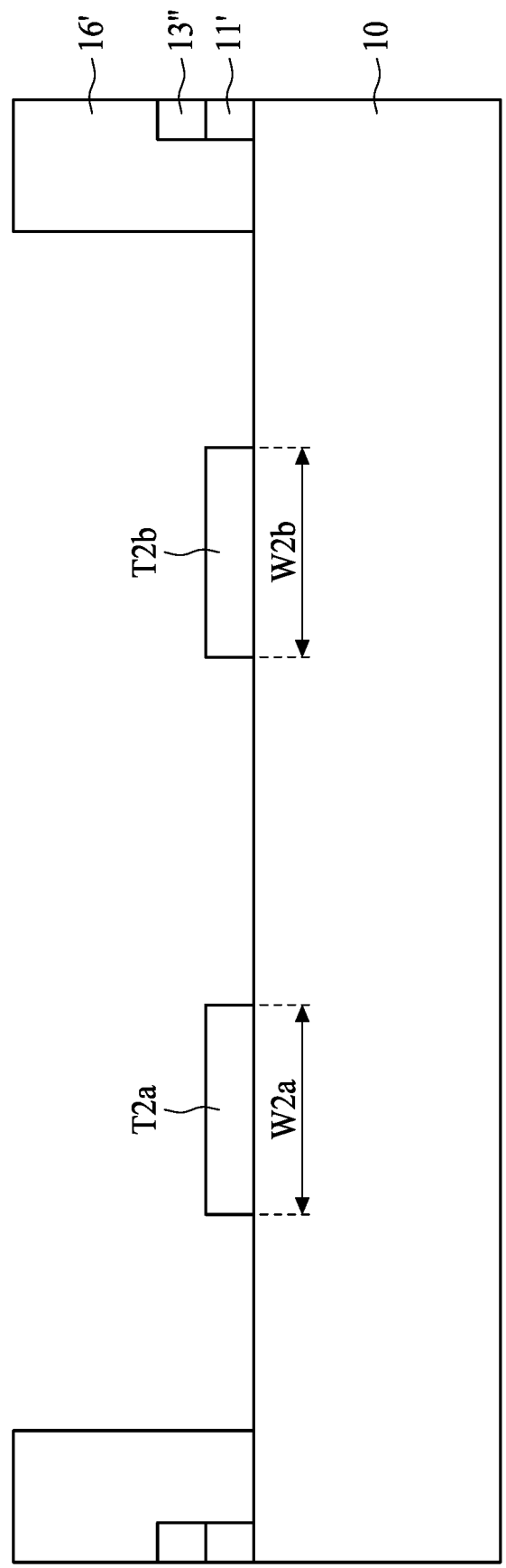
Figure 28:
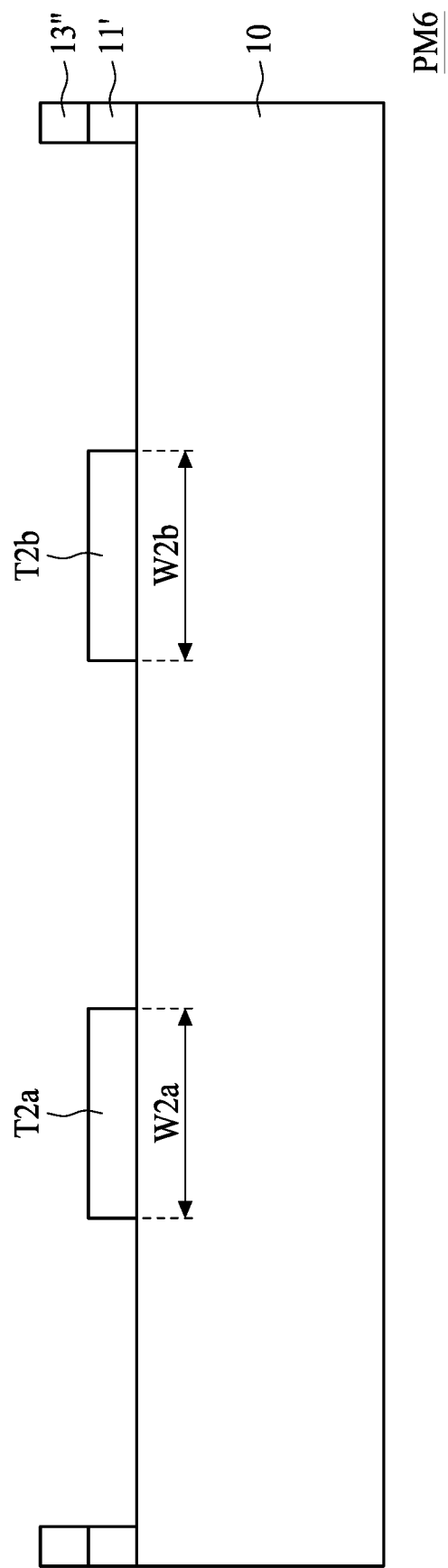

Referring to FIG. 26, a patterned photoresist layer 16' is formed covering portions of the patterned hard layer 13'. Referring to FIG. 27, portions of the patterned hard layer 13' exposed through the patterned photoresist layer 16' are removed to form a patterned hard layer 13". Referring to FIG. 28, the patterned photoresist layer 16' is then removed to form a photomask PM6.

A photomask formed following the above-illustrated methods is used in a lithographic/patterning operation of a semiconductor substrate. The photomask may include one or more reference patterns and one or more beta patterns in the peripheral region. In some embodiments, the photomask includes a chip region A1 and a peripheral region A2 adjacent to the chip region A1. In some embodiments, the photomask includes a design pattern A1a in the chip region A1, and a plurality of test patterns, including at least one of the reference patterns and at least one of the beta patterns, in the peripheral region A2. The test patterns are separated from the design pattern. In some embodiments, the reference pattern has a first boundary (B1 or B2) and the beta pattern has a second boundary (B1a, B1b, B2a or B2b), wherein a roughness of the second boundary is greater than a roughness of the first boundary. In some embodiments, a roughness of the second boundary is greater than a roughness of the first boundary, and a difference between a width of the beta pattern and a width of the reference pattern is within a tolerance.

In some embodiments, a photomask can include one or more beta patterns T1a, T1b, T2a and T2b, which are formed in a manner similar to that of the beta patterns shown in FIG. 7 (e.g., with a slightly greater roughness, a slightly smaller width, a slightly greater width or a combination thereof relative to the corresponding reference patterns R1 and/or R2), but the photomask can still pass the inspection if the variations detected are within the respective tolerances. In some embodiments, the design pattern of the photomask is transferred to the semiconductor substrate if the photomask passes one or more inspections during the fabrication. In some embodiments, if the photomask fails the inspection, the patterned layer (e.g. the patterned photoresist layer 15', the patterned hard layer 13' or the patterned mask layer 14') is removed and reformed over the shielding layer 11. A quality of the patterned semiconductor substrate is ensured, and defects of the semiconductor substrate resulting from a low-quality photomask are prevented. A product yield of semiconductor substrates or devices is therefore enhanced.

Some embodiments of the present disclosure provide a method for fabricating a photomask. The method includes: receiving a photomask substrate having a chip region and a peripheral region adjacent to the chip region; forming a reference pattern by emitting one first radiation shot in the peripheral region; forming a first beta pattern by emitting a plurality of second radiation shots in the peripheral region, wherein the emission of the plurality of second radiation shots is performed along a first direction; and comparing a roughness of a boundary of the first beta pattern along the first direction and a roughness of a boundary of the reference pattern along the first direction from a top view perspective.

Some embodiments of the present disclosure provide a method for manufacturing a semiconductor. The method includes: receiving a photomask substrate including a shielding layer; defining a chip region and a peripheral region adjacent to the chip region; forming a design pattern in the chip region; forming a reference pattern by emitting one first radiation shot and a beta pattern by emitting a plurality of second radiation shots in the peripheral region, wherein a pixel size of the first radiation shot is greater than a pixel size of the second radiation shot; comparing a reference roughness of a boundary of the reference pattern and a beta roughness of a boundary of the beta pattern; transferring the design pattern to the shielding layer if a difference between the reference roughness and the beta roughness is within a tolerance; and transferring the design pattern of the photomask to a semiconductor substrate.

Some embodiments of the present disclosure provide a photomask structure. The photomask structure includes: a chip region and a peripheral region adjacent to the chip region; a design pattern in the chip region; and a plurality of test patterns in the peripheral region, separated from the design pattern. The plurality of test patterns includes: a reference pattern, having a first boundary; and a beta pattern, having a second boundary, wherein a roughness of the second boundary is greater than a roughness of the first boundary.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a photomask, comprising:
receiving a photomask substrate having a chip region and a peripheral region adjacent to the chip region;
forming a reference pattern by emitting one first radiation shot in the peripheral region;
forming a first beta pattern by emitting a plurality of second radiation shots in the peripheral region, wherein the plurality of second radiation shots are emitted along a first direction;
comparing a roughness of a boundary of the first beta pattern along the first direction and a roughness of a boundary of the reference pattern along the first direction from a top view perspective;
adjusting an alignment of the plurality of second radiation shots if a result of the comparison exceeds a tolerance; and
forming the photomask if the result of the comparison is within the tolerance.

2. The method of claim 1, wherein the first radiation shot has a pixel size greater than a pixel size of each of the plurality of second radiation shots.

3. The method of claim 1, further comprising:
comparing a width of the first beta pattern and a width of the reference pattern from the top view perspective, wherein the width of the first beta pattern and the width of the reference pattern are measured along a second direction; and
adjusting a beam energy of the plurality of second radiation shots if a result of the comparison of the widths exceeds a tolerance.

4. The method of claim 3, wherein the first direction and the second direction are substantially parallel or substantially perpendicular.

5. The method of claim 3, wherein the photomask is formed if the result of the comparison of the widths is within the tolerance.

6. The method of claim 1, wherein the photomask substrate includes a shielding layer, a hard layer over the shielding layer and a photoresist layer over the hard layer, and the reference pattern and the first beta pattern are formed in the photoresist layer.

7. The method of claim 6, further comprising:
forming a design pattern in the chip region of the substrate; and
transferring the design pattern to the shielding layer if a difference between the roughness of the boundary of the first beta pattern and the roughness of the boundary of the reference pattern is within the tolerance.

8. The method of claim 1, wherein a photoresist layer of the photomask substrate includes a positive photoresist, and the reference pattern and the first beta pattern include spaces between portions of the photoresist layer.

9. The method of claim 1, wherein a photoresist layer of the photomask substrate includes a negative photoresist.

10. The method of claim 1, wherein the first direction is a longitudinal direction of the reference pattern.

11. The method of claim 1, further comprising:
forming a second beta pattern by emitting a plurality of third radiation shots in the peripheral region, wherein the emission of the plurality of third radiation shots is performed along a second direction substantially perpendicular to the first direction;
comparing a width of the second beta pattern to a width of the reference pattern from the top view perspective; and
adjusting a beam energy of the plurality of third radiation shots if a result of the comparison of the widths exceeds a tolerance.

12. A photomask structure, comprising:
a chip region and a peripheral region adjacent to the chip region;
a design pattern in the chip region; and
a plurality of test patterns in the peripheral region, separated from the design pattern, wherein the plurality of test patterns includes:
a reference pattern, having a first boundary; and
a beta pattern, having a second boundary, wherein a roughness of the second boundary is greater than a roughness of the first boundary.

13. The photomask structure of claim 12, wherein the reference pattern and the beta pattern are rectangular, and the first boundary and the second boundary extend along longitudinal directions of the reference pattern and the beta pattern, respectively.

14. A method for fabricating a photomask, comprising:
receiving a photomask substrate having a chip region and a peripheral region;
forming a reference pattern by emitting one first radiation shot in the peripheral region;
forming a first beta pattern by emitting a plurality of second radiation shots in the peripheral region, wherein the plurality of second radiation shots are emitted along a first direction, and the first radiation shot has a pixel size greater than a pixel size of each of the plurality of second radiation shots;
comparing a roughness of a boundary of the first beta pattern along the first direction and a roughness of a boundary of the reference pattern along the first direction from a top view perspective;
adjusting an alignment of the plurality of second radiation shots when a result of the comparison exceeds a tolerance;
forming a design pattern in the chip region when the result of the comparison is within the tolerance, wherein a dimension of the first radiation shot is the same as a minimum dimension of a radiation shot for forming the design pattern.

15. The method of claim 14, further comprising:
comparing a width of the first beta pattern and a width of the reference pattern from the top view perspective, wherein the width of the first beta pattern and the width of the reference pattern are measured along a second direction; and
adjusting a beam energy of the plurality of second radiation shots if a result of the comparison of the widths exceeds a tolerance,
wherein the first direction and the second direction are substantially parallel or substantially perpendicular.

16. The method of claim 14, wherein the photomask substrate includes a shielding layer, a hard layer over the shielding layer and a photoresist layer over the hard layer, and the reference pattern and the first beta pattern are formed in the photoresist layer.

17. The method of claim 16, further comprising transferring the design pattern to the shielding layer when the result of the comparison is within the tolerance.

18. The method of claim 14, wherein the first direction is a longitudinal direction of the reference pattern.

19. The method of claim 14, further comprising:
forming a second beta pattern by emitting a plurality of third radiation shots in the peripheral region, wherein the emission of the plurality of third radiation shots is performed along a second direction substantially perpendicular to the first direction;
comparing a width of the second beta pattern to a width of the reference pattern from the top view perspective; and
adjusting a beam energy of the plurality of third radiation shots if a result of the comparison of the widths exceeds a tolerance.

20. The method of claim 19, wherein the second beta pattern and the first beta pattern comprise a similar configuration and orientation.

* * * * *